United States Patent
Yoon et al.

(10) Patent No.: US 10,531,586 B2
(45) Date of Patent: Jan. 7, 2020

(54) ELECTRONIC DEVICE INCLUDING WATER REPELLENT STRUCTURE

(71) Applicant: Samsung Electronics Co., Ltd., Gyeonggi-do (KR)

(72) Inventors: Doosun Yoon, Gyeonggi-do (KR); Joohyun Kim, Seoul (KR); Soo-Hyun Park, Gyeonggi-do (KR); Seungbum Choi, Gyeonggi-do (KR); Min-Woo Yoo, Gyeonggi-do (KR); Jong-Chul Choi, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/866,740

(22) Filed: Jan. 10, 2018

(65) Prior Publication Data
US 2018/0206354 A1    Jul. 19, 2018

(30) Foreign Application Priority Data
Jan. 19, 2017    (KR) .......................... 10-2017-0009114

(51) Int. Cl.
*G06F 1/16* (2006.01)
*H05K 5/06* (2006.01)
*H05K 5/00* (2006.01)

(52) U.S. Cl.
CPC .......... *H05K 5/065* (2013.01); *G06F 1/1656* (2013.01); *H05K 5/0004* (2013.01); *H05K 5/0017* (2013.01); *H05K 5/0095* (2013.01)

(58) Field of Classification Search
CPC ............................ H05K 5/0095; G06F 1/1656
(Continued)

(56) References Cited

U.S. PATENT DOCUMENTS

| 8,126,138 B2 * | 2/2012 | Dinh ...................... H04M 1/03 379/433.02 |
| 9,225,105 B2 | 12/2015 | Cheong et al. |

(Continued)

FOREIGN PATENT DOCUMENTS

| KR | 10-1341308 B1 | 12/2013 |
| KR | 10-2014-0113789 A | 9/2014 |

(Continued)

OTHER PUBLICATIONS

International Search Report dated Apr. 23, 2018.

*Primary Examiner* — Anthony Q Edwards
(74) *Attorney, Agent, or Firm* — Cha & Reiter, LLC.

(57) ABSTRACT

An electronic device and method are disclosed. The electronic device includes a housing comprising at least one electronic component disposed within the electronic device, a first separation member configured to separate a first cavity at least partially exposed to an exterior of the electronic device through the housing from a second cavity in which the at least one electronic component is disposed; and a driver disposed in a third cavity spatially coupled with the second cavity in an interior of the housing, the driver configured to generate an air pressure differential between the second cavity and the first cavity. The method operates the device responsive to detecting a water immersion condition by outputting a sound by a speaker device, detecting the outputted sound through a microphone device, determining whether the detected sound matches a predetermined reference value and if so, operating a driver device to discharge the residual water.

21 Claims, 16 Drawing Sheets

(58) Field of Classification Search
USPC .......................... 361/679.3, 679.55, 679.56
See application file for complete search history.

(56) References Cited

U.S. PATENT DOCUMENTS

| | | |
|---|---|---|
| 9,363,587 B2 * | 6/2016 | Weiss .................. H04R 1/02 |
| 9,654,860 B2 | 5/2017 | Shin |
| 9,674,601 B2 | 6/2017 | Park |
| 9,955,244 B2 * | 4/2018 | Rothkopf ............... H04R 1/028 |
| 10,015,574 B1 * | 7/2018 | Luce .................. H04R 1/025 |
| 2012/0081875 A1 * | 4/2012 | Yamaguchi ........... G06F 1/1616 |
| | | 361/807 |
| 2012/0202559 A1 | 8/2012 | Shiogama et al. |
| 2015/0155614 A1 * | 6/2015 | Youn .................. H04M 1/0249 |
| | | 343/702 |
| 2015/0163572 A1 | 6/2015 | Weiss et al. |
| 2015/0195927 A1 | 7/2015 | Lee et al. |
| 2015/0253819 A1 | 9/2015 | Choi et al. |
| 2016/0052017 A1 | 2/2016 | Weber et al. |
| 2016/0116443 A1 | 4/2016 | Choi et al. |
| 2016/0334935 A1 | 11/2016 | Jeon |
| 2018/0035204 A1 * | 2/2018 | Park .................. H04R 1/025 |
| 2018/0084324 A1 * | 3/2018 | Vitt .................. H04R 1/023 |

FOREIGN PATENT DOCUMENTS

| | | |
|---|---|---|
| KR | 10-1499412 B1 | 3/2015 |
| KR | 10-2015-0082041 A | 7/2015 |
| KR | 10-2015-0082043 A | 7/2015 |
| KR | 10-2015-0085650 A | 7/2015 |
| KR | 10-2015-0105143 A | 9/2015 |
| KR | 10-2016-0049794 A | 5/2016 |
| KR | 10-2016-0103497 A | 9/2016 |

* cited by examiner

ELECTRONIC DEVICE INCLUDING WATER REPELLENT STRUCTURE

CLAIM OF PRIORITY

The present application is related to and claims priority under 35 U.S.C. § 119 to an application filed in the Korean Intellectual Property Office on Jan. 19, 2017 and assigned Serial No. 10-2017-0009114, the contents of which are incorporated herein by reference.

TECHNICAL FIELD

Various embodiments of the present disclosure relate to an electronic device including a water repellent structure.

BACKGROUND

As functional differentials among manufacturers of electronic devices have noticeably narrowed, the electronic devices are becoming slim in order to meet consumers' desires to purchase, and are developing to differentiate their functional elements while increasing rigidity of electronic devices and improving designs.

According to various embodiments, a waterproof function from among the differentiated functional elements of the electronic devices is very important to devices which are slim and are easy to carry. According to one embodiment, electronic devices may provide the waterproof function and it is very important to increase the waterproof effect.

SUMMARY

According to various embodiments, an electronic device may include at least one seal member disposed therein to implement a waterproof function. According to one embodiment, the seal member may be interposed between at least two elements (for example, a bracket, a housing, a display module, or the like) of the electronic device, and, when corresponding elements are coupled to each other, the seal member may implement the waterproof function by sealing an inner space of the electronic device.

According to various embodiments, an electronic device may include at least one electronic component disposed to have at least a portion thereof exposed to the outside of the electronic device. According to one embodiment, an electronic device may include a space opened from the inside to the outside, and an electronic component disposed inside the electronic device using the corresponding space may perform a function corresponding to an external environment. According to one embodiment, the electronic component may include a speaker module, a microphone module, a temperature/humidity detection sensor, an odor sensor, an interface connector port, or an ear jack module. According to one embodiment, the electronic device may utilize a space opened to allow at least a portion of the electronic component to be exposed to the external environment, and the corresponding space may include a separate separation member (for example, a seal member, a waterproof member, or an airtight member) applied for the sake of waterproofing.

However, when the electronic device is immersed in water, water may flow into the opened space, and waterproofing may be substantially implemented by the separation member, but water may permeate the separation member having a function of interworking with the external environment when the electronic device is immersed in water for a long time, or there may exist residual water on the periphery of the electronic component. Therefore, there is a problem that the electronic component cannot normally perform its own function. In particular, when the electronic component includes a speaker module, there may be a problem that sound quality of the speaker is degraded due to residual water existing in speaker holes.

To address the above-discussed deficiencies, the present disclosure provides an electronic device including a water repellent structure.

Another aspect of the present disclosure provides an electronic device including a water repellent structure which can remove residual water existing in the electronic device using an existing element.

According to an aspect of the present disclosure, an electronic device is disclosed including a speaker module including a front surface for outputting sound, and a side surface adjacent to the front surface, and a speaker housing at least partially enclosing the speaker module, wherein the speaker housing includes: a first separation member configured to separate a first cavity at least partially open to an exterior of the speaker housing from a second cavity formed on the front surface of the speaker module, and a driver disposed in a third cavity extending from the second cavity to generate an air pressure differential between the second cavity and the first cavity.

According to another aspect of the present disclosure, a method in an electronic device is disclosed, including detecting by a touch panel whether a water immersion condition exists, responsive to detecting the water immersion condition, outputting a sound by a speaker device, detecting the outputted sound through a microphone device, determining whether the detected sound matches a predetermined reference value for determining a presence of residual water within the electronic device, and when the detected sound matches the predetermined reference value, operating a driver device to discharge the residual water.

According to another aspect of the present disclosure, an electronic device is disclosed, including a housing comprising at least one electronic component disposed within the electronic device, a first separation member configured to separate a first cavity at least partially exposed to an exterior of the electronic device through the housing from a second cavity in which the at least one electronic component is disposed, and a driver disposed in a third cavity spatially coupled with the second cavity in an interior of the housing, the driver configured to generate an air pressure differential between the second cavity and the first cavity.

According to another aspect of the present disclosure, an apparatus for generating an air pressure differential in an electronic device is disclosed, including a motor housing disposed at least one of two positions within an interior of the electronic device, a vibrator configured to reciprocate relative to a driving shaft in an interior of the motor housing, and a member configured to generate the air pressure differential by controlling a flow of air generated by reciprocation of the vibrator.

BRIEF DESCRIPTION OF THE DRAWINGS

For a more complete understanding of the present disclosure and its benefits, reference is now made to the following description taken in conjunction with the accompanying drawings, in which like reference numerals represent like parts.

DETAILED DESCRIPTION

Figure 1:
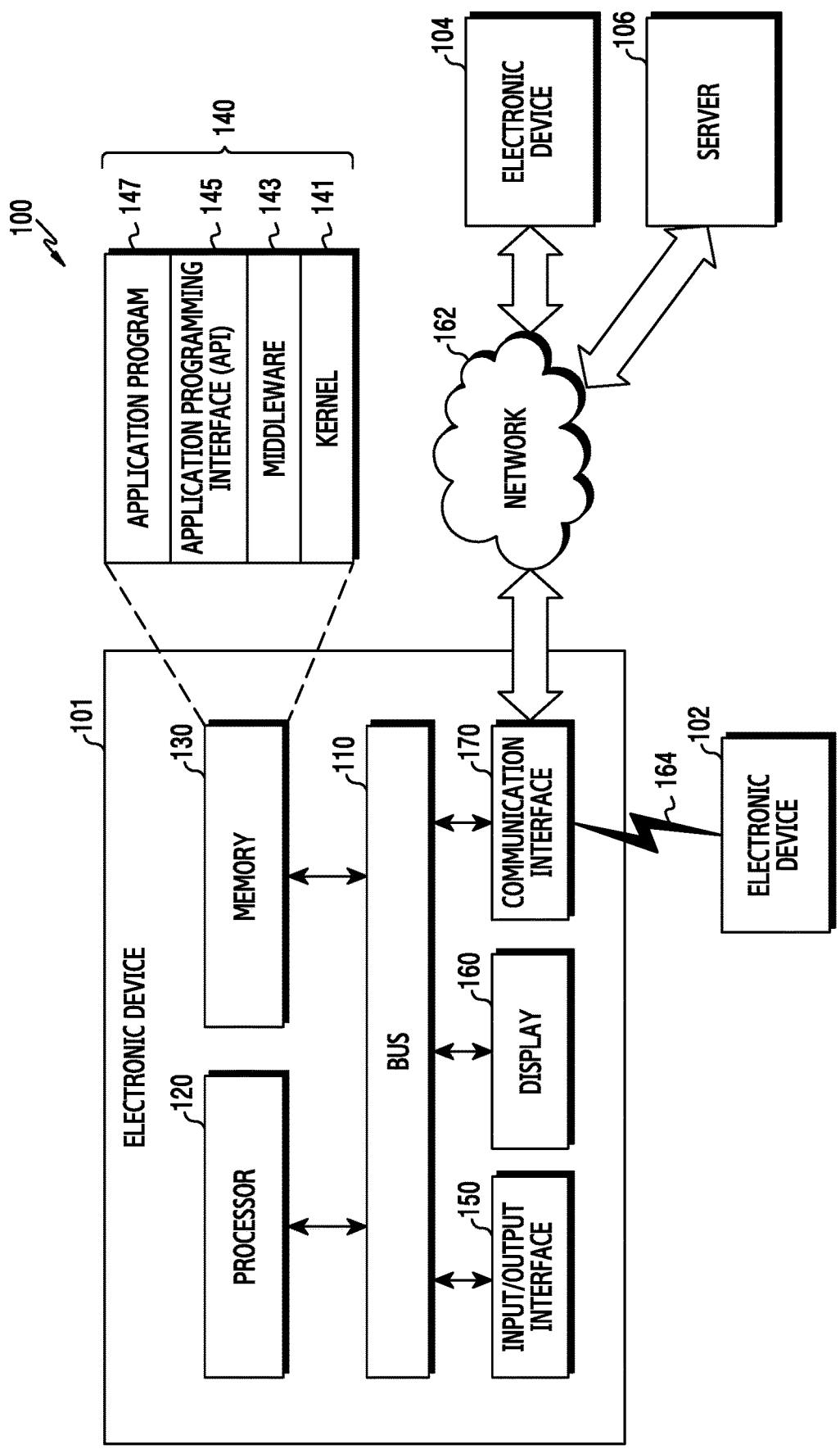
FIG. 1 is a view showing a network environment including an electronic device according to various embodiments of the present disclosure.

Various example embodiments of the present disclosure will now be described in greater detail with reference to the accompanying drawings. In the following disclosure, specific details such as detailed configuration and components are merely provided to assist the overall understanding of these example embodiments of the present disclosure. Therefore, it should be apparent to those skilled in the art that various changes and modifications of the various example embodiments described herein can be made without departing from the present disclosure. For example, those skilled in the art will understand that the principles of the present disclosure may be implemented in any suitably arranged electronic device.

In addition, descriptions of well-known functions and implementations may be omitted for clarity and conciseness.

The terms and words used in the following description and claims are not limited to their dictionary meanings, but are used to convey a clear and consistent understanding of the present disclosure. Accordingly, it should be apparent to those skilled in the art that the following description of embodiments of the present disclosure is provided for illustrative purposes only and not for the purpose of limiting the present disclosure, as defined by the appended claims and their equivalents.

Singular terms such as "a," "an," and "the" include plural references unless the context clearly dictates otherwise. Thus, for example, "a component surface" includes reference to one or more of such surfaces.

Herein, terms such as "have," "may have," "include," and "may include" indicate the presence of corresponding features (e.g., elements such as numerical values, functions, operations, or parts), but do not preclude the presence of additional features.

The terms "A or B," "at least one of A or/and B," and "one or more of A or/and B" include all possible combinations of the enumerated items. For example, "A or B," "at least one of A and B," or "at least one of A or B" means (1) at least one A, (2) at least one B, or (3) at least one A and at least one B.

Numerical terms such as "first" and "second" may modify various elements regardless of an order and/or importance of the elements, and do not limit the elements. These terms may be used for the purpose of distinguishing one element from another element. For example, a first user device and a second user device may indicate different user devices, regardless of the order or importance the devices. Accordingly, a first element may be referred to as a second element, and similarly, a second element may be referred to as a first element, without departing from the present disclosure.

When an element (e.g., a first element) is "(operatively or communicatively) coupled with/to" or "connected to" another element (e.g., a second element), the first element may be directly coupled with/to the second element, or there may be an intervening element (e.g., a third element) between the first element and the second element. However, when the first element is "directly coupled with/to" or "directly connected to" the second element, there is no intervening element therebetween.

Herein, the term "module" may refer, for example, to a unit including one of hardware, software, and firmware, or any combination thereof. The term "module" may be interchangeably used with terms, such as unit, logic, logical block, component, and circuit. A module may be a minimum unit of an integrally constituted component or may be a part thereof. A module may be a minimum unit for performing one or more functions or may be a part thereof. A module may be mechanically or electrically implemented. For example, a module may include, for example, and without limitation, at least one of a dedicated processor, a CPU, an application-specific integrated circuit (ASIC) chip, a field-programmable gate array (FPGA), and a programmable-logic device, which are known or will be developed and which perform certain operations.

All of the terms used herein, including technical or scientific terms, have the same meanings as those generally understood by a person having ordinary skill in the related art unless they are defined otherwise. Terms defined in a generally used dictionary should be interpreted as having the same or similar meanings as the contextual meanings of the relevant technology and should not be interpreted as having ideal or exaggerated meanings unless clearly defined as such herein. Even terms defined in the disclosure should not be interpreted as excluding embodiments of the present disclosure.

Example electronic devices may include smart phones, tablet personal computers (PCs), mobile phones, video telephones, electronic book readers, desktop PCs, laptop PCs, netbook computers, workstations, servers, personal digital assistants (PDAs), portable multimedia players (PMPs), Motion Picture Experts Group (MPEG-1 or MPEG-2) Audio Layer 3 (MP3) players, mobile medical devices, cameras, and/or wearable devices, or the like, but are not limited thereto. For example, the wearable devices may include accessory-type wearable devices (e.g., watches, rings, bracelets, anklets, necklaces, glasses, contact lenses, or head-mounted-devices (HMDs)), fabric or clothing integral wearable devices (e.g., electronic clothes), body-mounted wearable devices (e.g., skin pads or tattoos), and/or implantable wearable devices (e.g., implantable circuits), or the like but are not limited thereto.

The electronic devices may include smart home appliances, such as televisions (TVs), digital versatile disk (DVD) players, audio players, refrigerators, air conditioners, cleaners, ovens, microwave ovens, washing machines, air cleaners, set-top boxes, home automation control panels, security control panels, TV boxes (e.g., Samsung HomeSync™, Apple TV™, or Google TV™), game consoles (e.g., Xbox™ and PlayStation™), electronic dictionaries, electronic keys, camcorders, and/or electronic picture frames, or the like, but are not limited thereto.

The electronic devices may include various medical devices, such as various portable medical measurement devices (e.g., blood glucose meters, heart rate monitors, blood pressure monitors, thermometers, etc.), magnetic resonance angiography (MRA) devices, magnetic resonance imaging (MRI) devices, computed tomography (CT) devices, scanners, ultrasonic devices, etc., navigation devices, GPS receivers, event data recorders (EDRs), flight data recorders (FDRs), vehicle infotainment devices, electronic equipment for vessels (e.g., navigation systems, gyrocompasses, etc.), avionics, security devices, head units for vehicles, industrial or home robots, automatic teller machines (ATMs), point of sale (POS) devices, and/or Internet of Things (IoT) devices (e.g., light bulbs, sensors, electric or gas meters, sprinkler devices, fire alarms, thermostats, street lamps, toasters, exercise equipment, hot water tanks, heaters, boilers, etc.), or the like, but are not limited thereto.

The electronic devices may also include parts of furniture or buildings/structures, electronic boards, electronic signature receiving devices, projectors, or various measuring instruments (e.g., water meters, electricity meters, gas meters, wave meters, etc.), or the like, but are not limited thereto.

The electronic devices may be flexible electronic devices.

The electronic devices may be combinations of the above-described devices.

Additionally, the electronic devices are not limited to the above-described devices, and may include new electronic devices according to the development of new technologies.

Herein, the term "user" may refer to a person who uses an electronic device or may refer to a device (e.g., an artificial intelligence (AI) electronic device) which uses an electronic device.

FIG. 1 is a diagram illustrating an example network environment 100 including an electronic device, according to an example embodiment of the present disclosure.

Referring to FIG. 1, the network environment includes an electronic device 101, which includes a bus 110, a processor (e.g., including processing circuitry) 120, a memory 130, an input/output interface (e.g., including input/output circuitry) 150, a display 160, and a communication interface (e.g., including communication circuitry) 170. Alternatively, the electronic device 101 may omit at least one of the illustrated components and/or include additional components.

The bus 110 may include a circuit for connecting the components and delivering communications such as a control message therebetween.

The processor 120 may include various processing circuitry, such as, for example, and without limitation, at least one of a dedicated processor, a central processing unit (CPU), an application processor (AP), and/or a communication processor (CP). The processor 120 processes an operation or data on control of and/or communication with another component of the electronic device 101.

The processor 120 may also include a microprocessor or any suitable type of processing circuitry, such as one or more general-purpose processors (e.g., ARM-based processors), a digital signal processor (DSP), a programmable logic device (PLD), an ASIC, a field-programmable gate array (FPGA), a graphical processing unit (GPU), a video card controller, etc. In addition, when a general purpose computer accesses code for implementing the processing shown herein, the execution of the code transforms the general purpose computer into a special purpose computer for executing the processing shown herein.

The processor 120, which can be connected to an LTE network, may determine whether a call is connected over a circuit switched (CS) service network using caller identification information, such as a caller phone number of the CS service network, e.g., a 2G or a 3rd generation (3G) network. For example, the processor 120 receives incoming call information, such as a CS notification message or a paging request message of the CS service network over the LTE network, such as circuit-switched fallback (CSFB). The processor 120 being connected to the LTE network receives incoming call information, such as a paging request message over the CS service network, such as single radio LTE (SRLTE).

When receiving an incoming CS notification message or a paging request message of the CS service network over the LTE network, the processor 120 may obtain caller identification information from the incoming call information. The processor 120 may display the caller identification information on the display 160. The processor 120 may determine whether to connect the call based on input information corresponding to the caller identification information displayed on the display 160. For example, when detecting input information corresponding to an incoming call rejection, through the input/output interface 150, the processor 120 may restrict the voice call connection and maintain the LTE network connection. When detecting input information corresponding to an incoming call acceptance, through the input/output interface 150, the processor 120 may connect the voice call by connecting to the CS service network.

When receiving the incoming CS notification message or a paging request message of the CS service network over the LTE network, the processor 120 may obtain caller identification information from the incoming call information. The processor 120 may determine whether to connect the call by comparing the caller identification information with a reception control list. For example, when the caller identification information is included in a first reception control list, such as a blacklist, the processor 120 may restrict the voice call connection and maintain the connection to the LTE network. When the caller identification information is not included in the blacklist, the processor 120 may connect the voice call by connecting to the CS service network. When the caller identification information is included in a second reception control list, such as a white list, the processor 120 may connect the voice call by connecting to the CS service network.

When receiving the incoming call information, such as a paging request message of the CS service network over the LTE network, the processor 120 may send an incoming call response message, such as a paging response message, to the CS service network. The processor 120 may suspend the LTE service and receive the caller identification information, such as a circuit-switched call (CC) setup message, from the CS service network. The processor 120 may determine whether to connect the call by comparing the caller identification information with the reception control list. For example, when the caller identification information is included in the blacklist, the processor 120 restricts the voice call connection and resumes the LTE network connection. When the caller identification information is not included in the he blacklist, the processor 120 may connect the voice call by connecting to the CS service network. For example, when the caller identification information is included in the white list, the processor 120 connects the voice call by connecting to the CS service network.

The memory 130 may include volatile and/or nonvolatile memory. The memory 130 may store commands or data, such as the reception control list relating to at least another component of the electronic device 101. The memory 130 may store software and/or a program 140. The program 140 includes a kernel 141, middleware 143, an application programming interface (API) 145, and/or application programs (or applications) 147. At least some of the kernel 141, the middleware 143, and the API 145 may be referred to as an operating system (OS).

The kernel 141 may control or manage system resources, such as the bus 110, the processor 120, or the memory 130 used for performing an operation or function implemented by the other programs, such as the middleware 143, the API 145, or the applications 147. Further, the kernel 141 may provide an interface through which the middleware 143, the API 145, or the applications 147 connects the individual elements of the electronic device 101 to control or manage the system resources.

The middleware 143 may function as an intermediary for the API 145 or the applications 147 to communicate with the kernel 141, e.g., to exchange data.

In addition, the middleware 143 may process one or more task requests received from the applications 147 according to priorities thereof For example, the middleware 143 assigns priorities for using the system resources of the electronic device 101, to at least one of the applications 147. As another example, the middleware 143 performs scheduling or load balancing on the one or more task requests by processing the one or more task requests according to the priorities assigned thereto.

The API 145 is an interface through which the applications 147 may control functions provided from the kernel 141 or the middleware 143, and may include at least one interface or function, such as an instruction for file control, window control, image processing, or text control.

The input/output interface 150 may include various input/output circuitry and function as an interface that transfers instructions or data input from a user or another external device to the other element(s) of the electronic device 101. Further, the input/output interface 150 may output the instructions or data received from the other element(s) of the electronic device 101 to the user or an external electronic device.

The display 160 may include a liquid crystal display (LCD), a light emitting diode (LED) display, an organic LED (OLED) display, a micro electro mechanical system (MEMS) display, an electronic paper display, or the like, but is not limited thereto. The display 160 may display various types of content, such as text, images, videos, icons, or symbols. The display 160 may display a web page.

The display 160 may include a touch screen, which receives a touch, a gesture, proximity, a hovering input, etc., using an electronic pen or a user's body part (e.g., a finger).

The communication interface 170 may include various communication circuitry and establish communication between the electronic device 101 and a first external electronic device 102, a second external electronic device 104, and/or a server 106. For example, the communication interface 170 communicates with the first external electronic device 102, the second external electronic device 104, and/or the server 106 through the network 162 using wireless communication or wired communication or via a short-range communication 164. For example, the wireless communication conforms to a cellular communication protocol including at least one of LTE, LTE-advanced (LTE-A), code division multiple access (CDMA), WCDMA, universal mobile telecommunication system (UMTS), wireless broadband (WiBro), and GSM.

The wired communication may include at least one of a universal serial bus (USB), a high definition multimedia interface (HDMI), a recommended standard 232 (RS-232), and a plain old telephone service (POTS).

The network 162 may include a telecommunications network, a computer network such as local area network (LAN) or wide area network (WAN), the Internet, and a telephone network.

The electronic device 101 may provide an LTE service in a single radio environment by use of at least one module functionally or physically separated from the processor 120.

Each of the first and second external electronic devices 102 and 104 may be the same or different type of device as the electronic device 101.

The server 106 may include a group of one or more servers.

All or some of the operations to be executed by the electronic device 101 may be executed by the first external electronic device 102, the second external electronic device 104, and/or the server 106. For example, when the electronic device 101 performs a certain function or service (automatically or by request), the electronic device 101 may request some functions that are associated therewith from the first external electronic device 102, the second external electronic device 104, and/or the server 106, instead of or in addition to executing the function or service itself. The first external electronic device 102, the second external electronic device 104, and/or the server 106 may execute the requested functions or additional functions, and may transmit the results to the electronic device 101. The electronic device 101 may provide the requested functions or services by processing the received results. For example, a cloud computing technique, a distributed computing technique, or a client-server computing technique may be used.

According to various example embodiments, the processor 210 may determine a current mode of the electronic device based on a result detected in at least one of the above-described sensor modules according to an example embodiment of the present disclosure. According to an example embodiment, the processor 210 may generate a control signal based on the determined current mode, and may adjust an operating frequency band of a conductive member of the electronic device in a low band by controlling a tunable circuit using the corresponding control signal.

Figure 2:
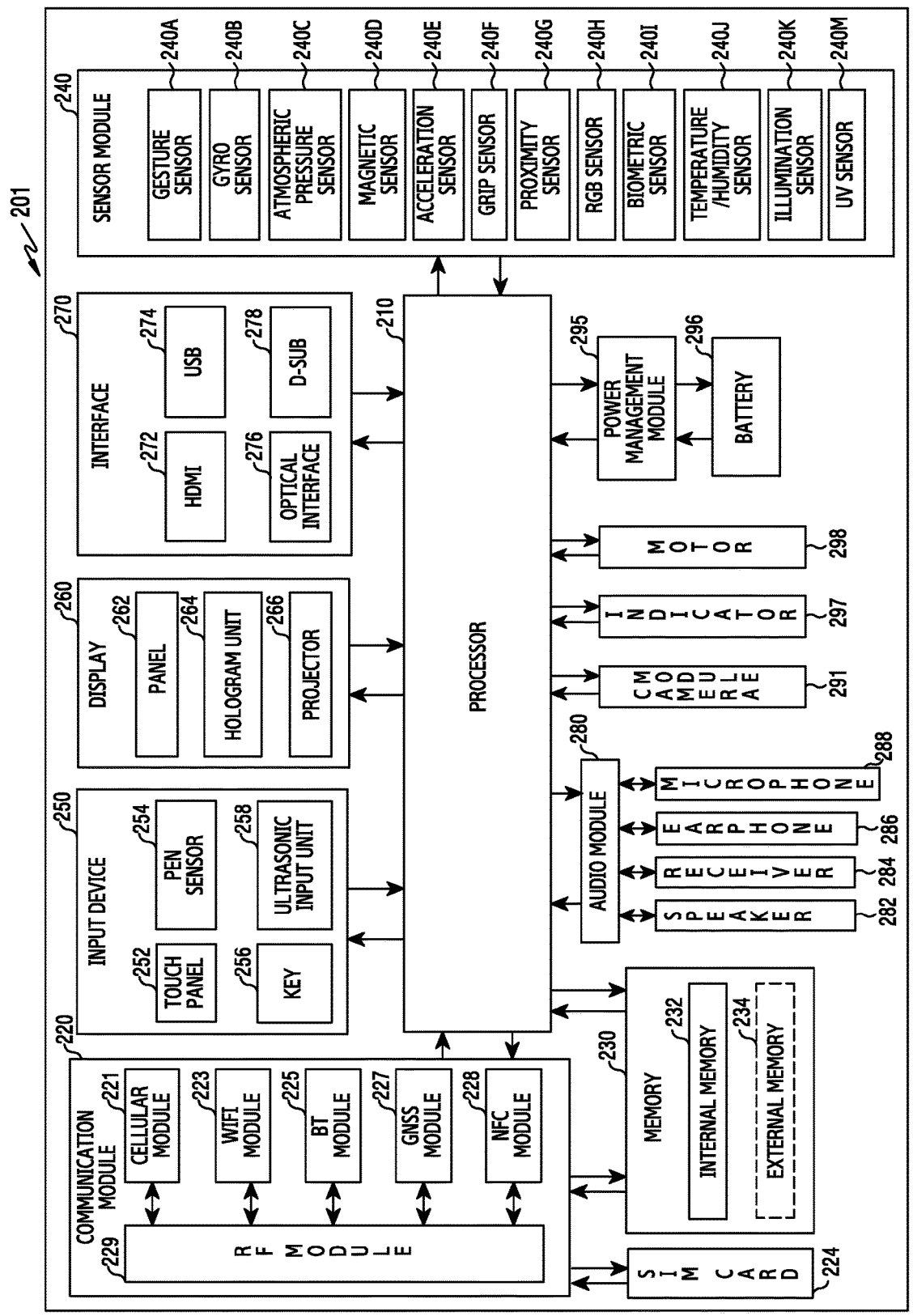
FIG. 2 is a block diagram of an electronic device according to various embodiments of the present disclosure.

FIG. 2 is a diagram illustrating an example electronic device, according to an example embodiment of the present disclosure.

Referring to FIG. 2, the electronic device 201 includes a processor (e.g., including processing circuitry) 210, a communication module (e.g., including communication circuitry) 220, a subscriber identification module (SIM) card 224, a memory 230, a sensor module 240, an input device (e.g., including input circuitry) 250, a display 260, an interface (e.g., including interface circuitry) 270, an audio module 280, a camera module 291, a power management module 295, a battery 296, an indicator 297, and a motor 298.

The processor 210 may include various processing circuitry and control a plurality of hardware or software elements connected to the processor 210 by driving an OS or an application program. The processor 210 may process a variety of data, including multimedia data, perform arithmetic operations, may be implemented with a system on chip (SoC), and may further include a GPU.

The communication module 220 may include various communication circuitry and perform data transmission/reception between an external electronic device and/or a server, which may be connected with the electronic device through a network. The communication module 220 may include various communication circuitry, such as, for example, and without limitation, at least one of a cellular module 221, a Wi-Fi module 223, a Bluetooth® (BT) module 225, a global navigation satellite system (GNSS) or GPS module 227, a near field communication (NFC) module 228, and a radio frequency (RF) module 229.

The cellular module 221 may provide a voice call, a video call, a text service, or an Internet service through a communication network, such as LTE, LTE-A, CDMA, WCDMA, UMTS, WiBro, or GSM. In addition, the cellular module 221 may identify and authenticate the electronic device within the communication network by using the SIM card 224. The cellular module 221 may perform at least some of the functions that can be provided by the processor 210. For example, the cellular module 221 may perform multimedia control functions.

The cellular module 221 may include a CP. Further, the cellular module 221 may be implemented, for example, with an SoC.

Although elements, such as the cellular module 221, the memory 230, and the power management module 295 are illustrated as separate elements with respect to the processor 210 in FIG. 2, the processor 210 may also be implemented such that at least one part of the aforementioned elements, e.g., the cellular module 221, is included in the processor 210.

The processor 210 or the cellular module 221 may load an instruction or data, which is received from each non-volatile memory connected thereto or at least one of different elements, to a volatile memory and processes the instruction or data. In addition, the processor 210 or the cellular module 221 may store data, which is received from at least one of different elements or generated by at least one of different elements, into a non-volatile memory.

Each of the Wi-Fi module 223, the BT module 225, the GNSS module 227, and the NFC module 228 may include a processor for processing data transmitted/received through a corresponding module. Although the cellular module 221, the Wi-Fi module 223, the BT module 225, the GNSS module 227, and the NFC module 228 are illustrated in FIG. 2 as separate blocks, at least two of the cellular module 221, the Wi-Fi module 223, the BT module 225, the GNSS module 227, and the NFC module 228 may be included in one integrated chip (IC) or IC package. For example, at least some of processors corresponding to the cellular module 221, the Wi-Fi module 223, the BT module 225, the GNSS module 227, and the NFC module 228, such as a communication processor corresponding to the cellular module 221 and a Wi-Fi processor corresponding to the Wi-Fi module 223, may be implemented with an SoC.

The RF module 229 may transmit/receive data, such as an RF signal, and may include a transceiver, a power amp module (PAM), a frequency filter, or a low noise amplifier (LNA). In addition, the RF module 229 may further include a component for transmitting/receiving a radio wave on a free space in wireless communication, e.g., a conductor or a conducting wire. The cellular module 221, the Wi-Fi module 223, the BT module 225, the GNSS module 227, and the NFC module 228 may share the RF module 229, or at least one of these modules may transmit/receive an RF signal via a separate RF module.

The SIM card 224 may be inserted into a slot formed in the electronic device. The SIM card 224 includes unique identification information, such as an integrated circuit card identifier (ICCID) or subscriber information, such as an international mobile subscriber identity (IMSI).

The memory 230 includes an internal memory 232 and/or an external memory 234.

The internal memory 232 may include at least one of a volatile memory, such as a dynamic random access memory (DRAM), a static RAM (SRAM), or a synchronous dynamic RAM (SDRAM) or a non-volatile memory, such as a one-time programmable read only memory (OTPROM), a programmable ROM (PROM), an erasable and programmable ROM (EPROM), an electrically erasable and programmable ROM (EEPROM), a mask ROM, a flash ROM, a not and (NAND) flash memory, and a not or (NOR) flash memory. The internal memory 232 may be a solid state drive (SSD).

The external memory 234 may include a flash drive, a compact flash (CF), secure digital (SD), micro-SD, mini-SD, extreme digital (xD), and a memory stick, and may be operatively coupled to the electronic device via various interfaces.

The electronic device may also include a storage unit (or a storage medium), such as a hard drive.

The sensor module 240 may measure a physical quantity or detect an operation state of the electronic device, and convert the measured or detected information into an electrical signal. The sensor module 240 includes a gesture sensor 240A, a gyro sensor 240B, an atmospheric pressure sensor 240C, a magnetic sensor 240D, an acceleration sensor 240E, a grip sensor 240F, a proximity sensor 240G, a color sensor 240H, (e.g., a red, green, blue or "RGB" sensor), a biometric sensor 240I, a temperature/humidity sensor 240J, an illumination sensor 240K, and an ultraviolet (UV) sensor 240M.

Additionally or alternatively, the sensor module 240 may include other sensors, e.g., an E-node sensor, an electromyography (EMG) sensor, an electroencephalogram (EEG) sensor, an electrocardiogram (ECG) sensor, and/or a fingerprint sensor.

The sensor module 240 may further include a control circuit for controlling at least one or more sensors included therein.

The input device 250 may include various input circuitry, such as, for example, and without limitation, at least one of a touch panel 252, a (digital) pen sensor 254, a key 256, and an ultrasonic input unit 258. The touch panel 252 may recognize a touch input by using at least one of an electrostatic type configuration, a pressure-sensitive type configuration, and an ultrasonic type configuration. The touch panel 252 may further include a control circuit. When the touch panel is of the electrostatic type, both physical contact recognition and proximity recognition are possible. The touch panel 252 may further include a tactile layer, which provides the user with a tactile reaction.

The (digital) pen sensor 254 may include a recognition sheet which can be a part of the touch panel or can be separately implemented from the touch panel. The (digital) pen sensor 254 may be implemented using the same or similar method of receiving a touch input of a user or using an additional recognition sheet.

The key 256 may include a physical button, an optical key, or a keypad.

The ultrasonic input device 258 may detect ultrasonic waves generated by an input tool through a microphone 288, and may confirm data corresponding to the detected ultrasonic waves.

The ultrasonic input unit 258 may detect a reflected sound wave through the microphone 288 and perform radio recognition. For example, an ultrasonic signal, which may be generated by using a pen, may be reflected off an object and detected by the microphone 288.

The electronic device may use the communication module 220 to receive a user input from an external device, such as a computer or a server connected thereto.

The display 260 includes a panel 262, a hologram device 264, and a projector 266.

The panel 262 may be an LCD or an AM-OLED and may be implemented in a flexible, transparent, or wearable manner. Alternatively, the panel 262 may be implemented as one module with the touch panel 252.

The hologram device 264 uses an interference of light and displays a stereoscopic image in the air.

The projector 266 displays an image by projecting a light beam onto a screen, which may be located inside or outside the electronic device.

The display 260 may further include a control circuit for controlling the panel 262, the hologram device 264, and/or the projector 266.

The interface 270 may include various interface circuitry, such as, for example, and without limitation, at least one of an HDMI 272, a USB 274, an optical communication interface 276, and a d-subminiature (D-sub) 278. The interface 270 may include a mobile high-definition link (MHL), SD/multi-media card (MMC), and/or infrared data association (IrDA).

The audio module 280 bilaterally converts a sound and an electric signal. The audio module 280 converts sound information, which is input or output through a speaker 282, a receiver 284, an earphone 286, and/or the microphone 288.

The speaker 282 may output a signal of an audible frequency band and a signal of an ultrasonic frequency band. Reflected waves of an ultrasonic signal emitted from the speaker 282 and a signal of an external audible frequency band may be received.

The camera module 291 captures an image and/or a video, and may include one or more image sensors, such as a front sensor or a rear sensor, a lens, an image signal processor (ISP), or a flash, such as an LED or a xenon lamp. Alternatively, the electronic device may include two or more camera modules.

The power management module 295 manages power of the electronic device. The power management module 295 may include a power management integrated circuit (PMIC), a charger IC, and/or a battery gauge.

The PMIC may be included in an IC or an SoC semiconductor and may use a wired charging and/or a wireless charging method. The charger IC may charge the battery 296 and may prevent an over-voltage or over-current flow.

Different types of wireless charging may include magnetic resonance type, magnetic induction type, and electromagnetic type. An additional circuit for the wireless charging, such as a coil loop, a resonant circuit, and/or a rectifier may be added.

The battery gauge may measure a residual quantity of the battery 296 and a voltage, current, and temperature during charging. The battery 296 stores or generates electricity and supplies power to the electronic device by using the stored or generated electricity. The battery 296 may include a rechargeable battery or a solar battery.

The indicator 297 indicates a specific state, such as a booting state, a message, or a charging state of the electronic device or a part thereof, such as the processor 210.

The motor 298 converts an electric signal into a mechanical vibration.

Alternatively, the electronic device includes a processing unit, such as a GPU, for supporting mobile TV, which processes media data according to a protocol, e.g., digital multimedia broadcasting (DMB), digital video broadcasting (DVB), and/or media flow.

According to various embodiments, the processor 210 may detect a water immersion condition using the touch panel 252. According to one embodiment, when the processor 210 detects the water immersion condition, the processor 210 may control the speaker 282 to generate a sound of a specific frequency band for detecting. According to one embodiment, the processor 210 may control the microphone 288 to detect the generated sound and may determine whether the detected sound falls within a predetermined at least one criterion range. According to one embodiment, the at least one criterion range may include a range value stored in the memory 230 by a developer. According to one embodiment, the processor 210 may determine whether immersion in water is maintained, whether there exists residual water after immersion in water, or a complete water repelling condition based on the at least one criterion range. According to one embodiment, when there exists residual water after the electronic device 201 is immersed in water, the processor 210 may drive the motor 298 and control the motor 298 to remove the residual water. According to one embodiment, the processor 210 may detect a posture of the electronic device using the gyro sensor 240B, and may control driving of the motor 298 for repelling water based on the detected posture.

Each of the elements described in the present disclosure may constitute one or more components, and the names of corresponding elements may vary according to a type of the electronic device. According to various embodiments, the electronic device may include at least one of the elements described in the present disclosure, and may omit some of the elements or may further include additional other elements. In addition, some of the elements of the electronic device according to various embodiments may be combined with each other so as to form a single entity, so that the functions of the elements may be performed in the same manner as before the combination.

As an example embodiment of the present disclosure, a speaker device using a space connected from an inside to an outside has been illustrated, and a water repellent structure applied to the same has been described. However, this should not be considered as limiting. For example, the water repellent structure may be used for various electronic components using the space connected from the inside to the outside, such as a microphone module, a temperature/humidity detection sensor, an odor sensor, an interface connector port, or an ear jack module.

Figure 3A:
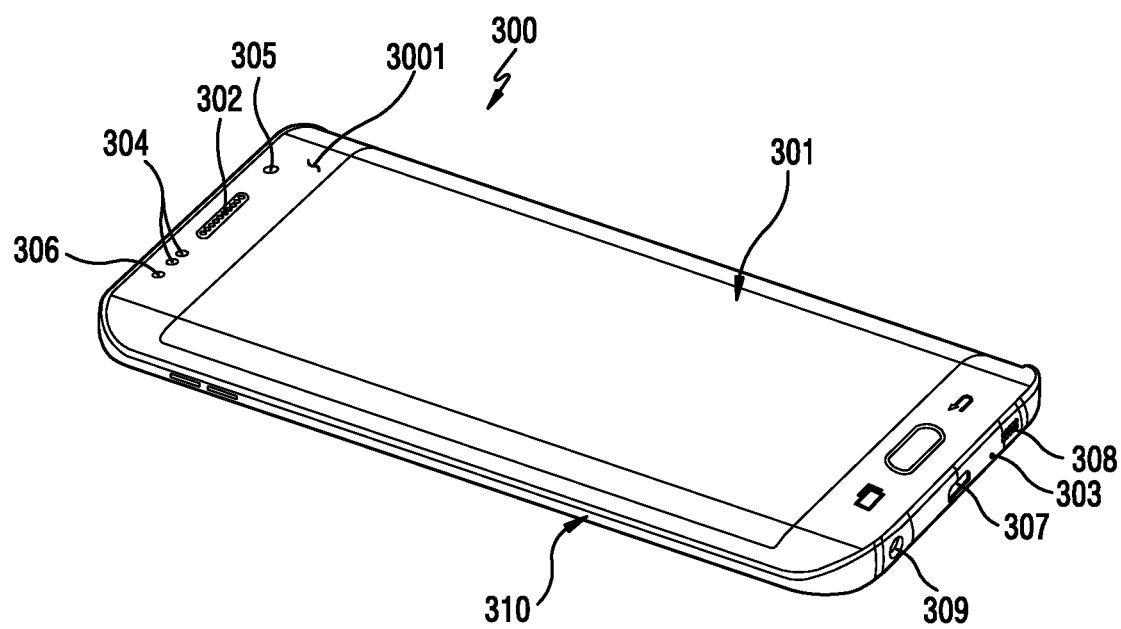
FIG. 3A is a perspective view of a front surface of an electronic device according to various embodiments of the present disclosure.
Figure 3B:
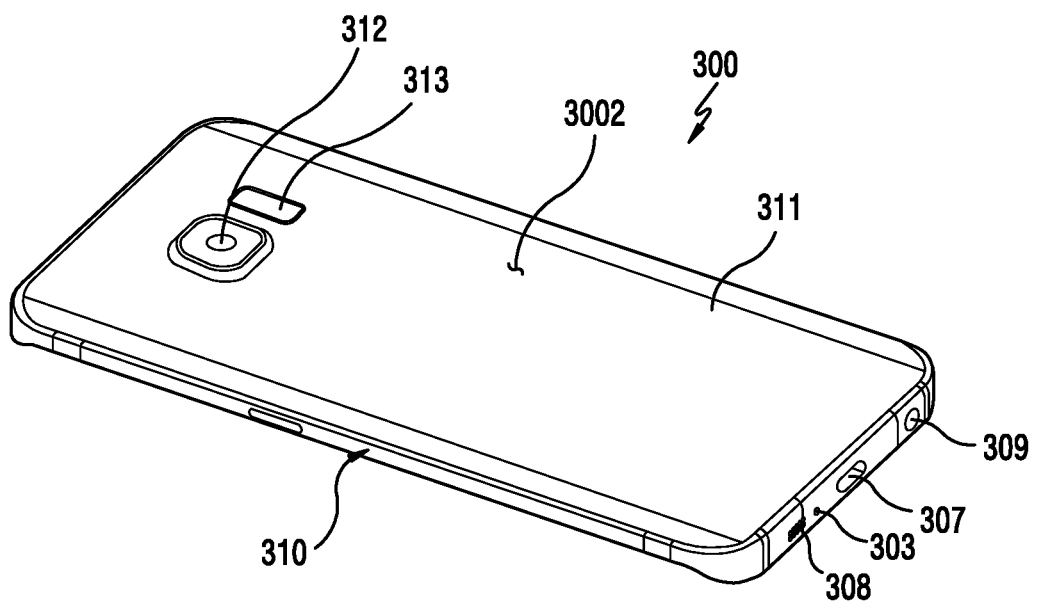
FIG. 3B is a perspective view of a rear surface of the electronic device according to various embodiments of the present disclosure.

FIG. 3A is a perspective view of a front surface of an electronic device according to various embodiments of the present disclosure. FIG. 3B is a perspective view of a rear surface of the electronic device according to various embodiments of the present disclosure.

The electronic device 300 of FIGS. 3A and 3B may be similar to the electronic device 101 of FIG. 1 or the electronic device 201 of FIG. 2 or may include other embodiments of the electronic device.

Referring to FIGS. 3A and 3B, the electronic device 300 may include a display 301 disposed on a first surface 3001 (for example, a front surface) thereof. According to one embodiment, the display 301 may include a touch sensor to operate as a touch screen device. According to one embodiment, the display 301 may include a pressure sensor to operate as a pressure reaction type touch screen device. According to one embodiment, the electronic device 300 may include a receiver 302 disposed to output a voice of the other person. According to one embodiment, the electronic device 300 may include a microphone device 303 disposed to transmit a user's voice to the other person.

According to various embodiments, the electronic device 300 may include components disposed on the periphery of the receiver 302 to perform various functions of the electronic device 300. According to one embodiment, the components may include at least one sensor module 304. The sensor module 304 may include at least one of, for example, an illuminance sensor (for example, a light sensor), a proximity sensor (for example, a light sensor), an infrared sensor, an ultrasonic sensor, a fingerprint recognition sensor, or an iris recognition sensor. According to one embodiment, the components may include a front camera device 305. According to one embodiment, the components may include an indicator 306 (for example, an LED device) for notifying the user of state information of the electronic device.

According to various embodiments, the electronic device 300 may include a speaker device 308 disposed at one side of the microphone device 303. According to one embodiment, the electronic device 300 may include an interface connector port 307 disposed at the other side of the microphone device 303 to perform a data exchange function functionally interworking with an external device and to receive external power and charge the electronic device 300. According to one embodiment, the electronic device 300 may include an ear jack hole 309 disposed at one side of the interface connector port 307.

According to various embodiments, the electronic device 300 may include a housing 310. According to one embodiment, the housing 310 may be formed of a conductive member or a nonconductive member. According to one embodiment, the housing 310 may be disposed along the border of the electronic device 300 and may be disposed to extend to a portion of the front surface or at least a portion of the rear surface. According to one embodiment, the housing 310 may define at least a portion of a thickness of the electronic device 300 along the border of the electronic device 300, and may be formed in a closed loop shape. However, this should not be considered as limiting, and the housing 310 may be formed to contribute to at least a portion of the thickness of the electronic device 300. According to one embodiment, the housing 310 may have at least a portion embedded in the electronic device 300.

According to various embodiments, the electronic device 300 may include a rear surface window 311 disposed on a second surface 3002 (for example, a rear surface) facing the first surface 3001. According to one embodiment, the electronic device 300 may include a rear camera device 312 disposed through the rear surface window 311. According to one embodiment, the electronic device 300 may include at least one electronic component 313 disposed at one side of the rear camera device 312. According to one embodiment, the electronic component 313 may include at least one of an illuminance sensor (for example, a light sensor), a proximity sensor (for example, a light sensor), an infrared sensor, an ultrasonic sensor, a heart rate sensor, a flash device, or a fingerprint recognition sensor.

According to various embodiments, the electronic device 300 may include at least one seal member for waterproofing. According to one embodiment, the speaker device 308 may include at least one separation member for separating an outside space and an inside space of the electronic device 300 from each other. According to one embodiment, the electronic device may include a water repellent structure (for example, a water repellent device) for detecting residual water existing in the inside space of the speaker device and then repelling water to the outside. Hereinafter, a speaker device having such a water repellent structure and an electronic device including the same will be described in detail.

Figure 4:
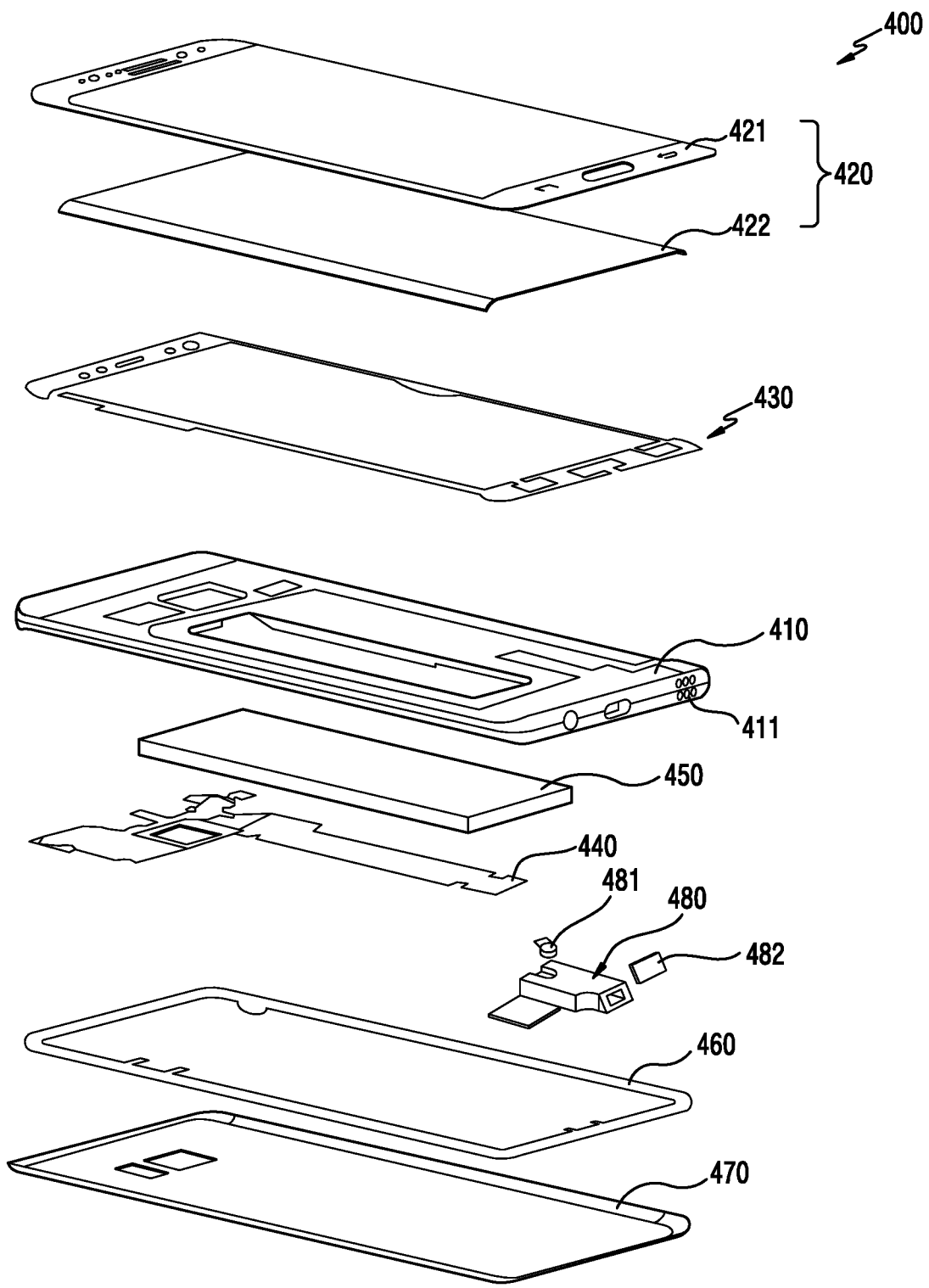
FIG. 4 is an exploded perspective view of an electronic device according to various embodiments of the present disclosure.

FIG. 4 is an exploded perspective view of an electronic device according to various embodiments of the present disclosure.

The electronic device 400 of FIG. 4 may be similar to the electronic device 300 of FIGS. 3A and 3B or may be other embodiments of the electronic device.

Referring to FIG. 4, the electronic device 400 may include a housing 410, at least one first seal member 430 disposed on one side of the housing 410 in a stacking manner, and a display 420 including a window 421 (for example, a glass plate) and a display module 422 attached to the bottom surface of the window 421. According to one embodiment, the electronic device 400 may include a substrate 440 (for example, a printed circuit board (PCB), a flexible printed circuit (FPC), or the like), a battery 450, a second seal member 460, and a rear surface window 470 which are arranged on a rear surface (for example, a second surface) of the housing 410. Although not shown, a middle housing (for example, a bracket or a rear housing) may further be included between the housing 410 and the rear surface window 470.

According to various embodiments, the electronic device 400 may further include a wireless power transmission/reception member (not shown). According to one embodiment, the electronic device 400 may further include a detection member (not shown) for detecting an electronic pen applied as a data inputting means. According to one embodiment, the detection member may include an electromagnetic resonance (EMR) sensor pad which operates in an electromagnetic induction method to receive a feedback signal generated by a resonant frequency of a coil body provided in the electronic pen.

According to various embodiments, the battery 450 may be accommodated in an accommodation space formed in the housing 410, and may be disposed to avoid the substrate 440 or overlap at least a portion of the substrate 440. According to one embodiment, the battery 450 and the substrate 440 may not overlap each other and may be disposed in parallel to each other.

According to various embodiments, the display 420 may include the window 421 and the display module 422 disposed on the bottom surface of the window 421. According to one embodiment, the display module 422 may include a touch sensor or a pressure detection sensor.

According to various embodiments, the electronic device 400 may include a first seal member 430 disposed between the display module 422 of the display 420 and the housing 410. According to one embodiment, the second seal member 460 may be interposed between the housing 410 and the rear surface window 470. According to one embodiment, by this implementation, the electronic device 400 may be provided with a waterproof structure preventing water from permeating an interior cavity (e.g., the inside space) formed within the housing 410, by the positioning and installation of the first seal member 430 and the second seal member 460. According to one embodiment, one or more materials used to create the first seal member 430 and the second seal member 470 may include at least one of double-sided tape, an adhesive, silicon, waterproof rubber, urethane or any other material that provides or aids in generating a waterproof seal.

According to various embodiments, the electronic device 400 may include a speaker device 480 disposed at a location corresponding to a speaker hole 411 of the housing 410. According to one embodiment, the speaker device 480 may include a driver 481 for repelling residual water existing in the speaker hole 411 or a sound guide space after the electronic device 400 is immersed in water. According to one embodiment, the driver 481 may be used as a tactile sensation generating means (e.g., a haptic feedback module) of the electronic device 400. According to one embodiment, the driver 481 may include a vibrator. According to one embodiment, the speaker device 480 may include a first separation member 482 disposed between the speaker device 480 and the speaker hole 411 of the housing 410. According to one embodiment, the first separation member 482 may be formed of a material capable of blocking water entering from the outside and easily discharging a speaker sound from the inside. According to one embodiment, the first separation member 482 may include a mesh.

Figure 5A:
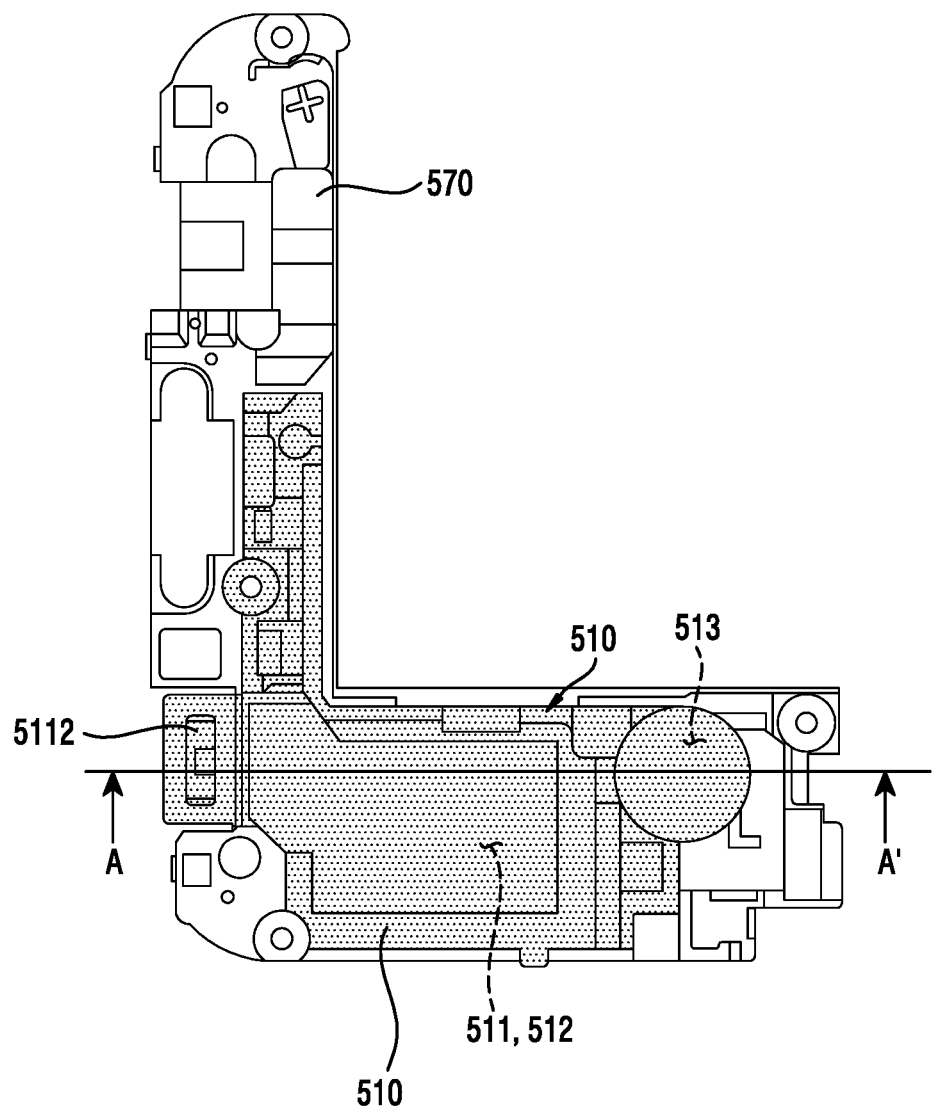
FIG. 5A is a configuration view showing a state in which a speaker device is disposed according to various embodiments of the present disclosure.
Figure 5B:
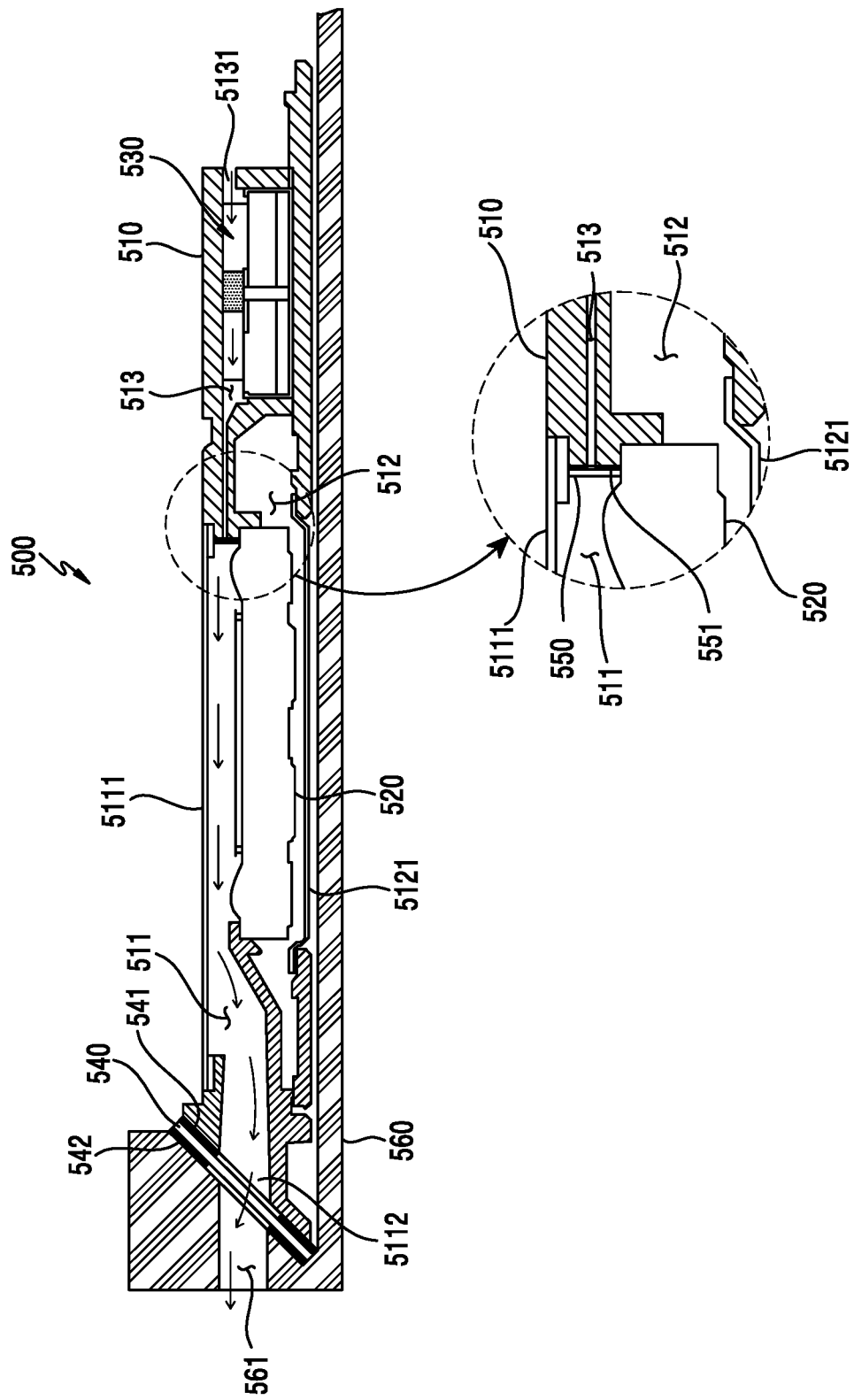
FIG. 5B is a cross section view showing a state in which the speaker device is installed in an electronic device according to various embodiments of the present disclosure.

FIG. 5A is a configuration view showing a state in which a speaker device is disposed according to various embodiments of the present disclosure. FIG. 5B is a cross section view showing a state in which the speaker device is installed in an electronic device according to various embodiments of the present disclosure.

The speaker device 500 of FIGS. 5A and 5B may be similar to the speaker device 308 of FIGS. 3A and 3B or the speaker device 480 of FIG. 4, or may include other embodiments of the speaker device.

Referring to FIG. 5A, the speaker device 500 may be mounted in an inner bracket 570 disposed inside the electronic device. According to one embodiment, the inner bracket 570 may be mounted in a housing (for example, the housing 410 of FIG. 4) of the electronic device.

FIG. 5B is a cross section view of a speaker housing of FIG. 5A taken along line A-A'.

In FIG. 5B, the speaker device 500 is illustrated without the inner bracket 570 of FIG. 5A and a speaker housing 510 is directly disposed in the housing 560 of the electronic device.

Referring to FIG. 5B, the speaker device 500 may be directly mounted in the housing 560 of the electronic device without a separate bracket. According to one embodiment, the speaker device 500 may include the speaker housing 510 including at least one inside space. According to one embodiment, the speaker housing 510 may be disposed in the housing 560 of the electronic device. According to one embodiment, the speaker housing 510 may include a first plate 5111 for closing an upper opening and a second plate 5121 for closing a lower opening. According to one embodiment, the first and second plates 5111 and 5121 may include a "SUS" plate. However, other implementations are possible, and the speaker housing 510 may be integrally formed to have a sealed space without the first and second plates. In this case, the speaker housing 510 may be formed of synthetic resin by injection molding.

According to various embodiments, the speaker housing 510 may include an opening 5112 (such as a speaker hole) adjacent to a first space 561 (or hollow, cavity, etc.) opened to the outside of the housing 560. According to one embodiment, the speaker housing 510 may include a second space 511 (or hollow, cavity, etc.) interworking with the opening 5112 and having a speaker module 520 mounted therein. According to one embodiment, the speaker housing 510 may include a third space 513 spatially connected to the second housing 511. According to one embodiment, the speaker housing 510 may include a driver 530 disposed in the third space 513. According to one embodiment, the speaker housing 510 may include a fourth space 512 partially separated from the second space 511 to provide an acoustic pressure according to a mounting structure of the speaker module 520.

According to various embodiments, the speaker housing 510 may include a first separation member 540 disposed to spatially separate the first space 561 and the opening 5112 of the second space 511 adjacent to the first space 561 from each other. According to one embodiment, the first separation member 540 may include a mesh attached between the housing 560 and the opening 5112 by fixing or adhering members 541, 542. According to one embodiment, the first adhering member may include a double-sided tape and sealing rubber. According to one embodiment, the sealing rubber may be disposed between the housing 560 and the speaker module in an elastically compressed manner to prevent water entering from the first space 561 from permeating the inside of the electronic device in addition to the speaker housing 510. According to one embodiment, the mesh may be attached using a double-sided tape, rubber, urethane, or silicon. According to one embodiment, the mesh may block external water and may discharge a sound emitted through the speaker module 520 to the outside through the first space 561. However, this should not be considered as limiting, and the first separation member 540 may include a hydrophobic member disposed in a particular direction as to be oriented toward the first space 561 and may have a hydrophilic member disposed in a direction oriented towards the second space 511 to be adjacent to the hydrophobic member, thereby promoting waterproofing and repelling residual water existing therein.

According to various embodiments, the speaker housing 510 may include a second separation member 550 disposed to spatially separate the third space 513 in which the driver 530 is disposed and the second space 511 in which the speaker module 520 is disposed from each other. According to one embodiment, the second separation member 550 may include a "Goretex" member attached by a double-sided tape 551. The second separation member 550 may prevent water entering the second space 511 through the first space 561 from permeating the third space 513 when the electronic device is immersed in water.

According to various embodiments, the driver 530 may be disposed in the third space 513 of the speaker housing 510. According to one embodiment, the driver 530 may be configured to discharge water which remains in the first space 561 or enters the second space 511 through the first separation member 540 due to water pressure and remains in the second space 511 by using difference in air pressure between the first space 561 and the second space 511. According to one embodiment, the driver 530 may discharge air which is drawn in through an air inlet 5131 connected to the inside of the electronic device in the third space 513 to the first space 561 through the second space 511, thereby causing water to be discharged with air. According to one embodiment, the driver 530 may be used as a means for providing a tactile sensation of the electronic device with a water repellent operation. According to one embodiment, the driver 530 may include a vibrator.

Figure 6A:
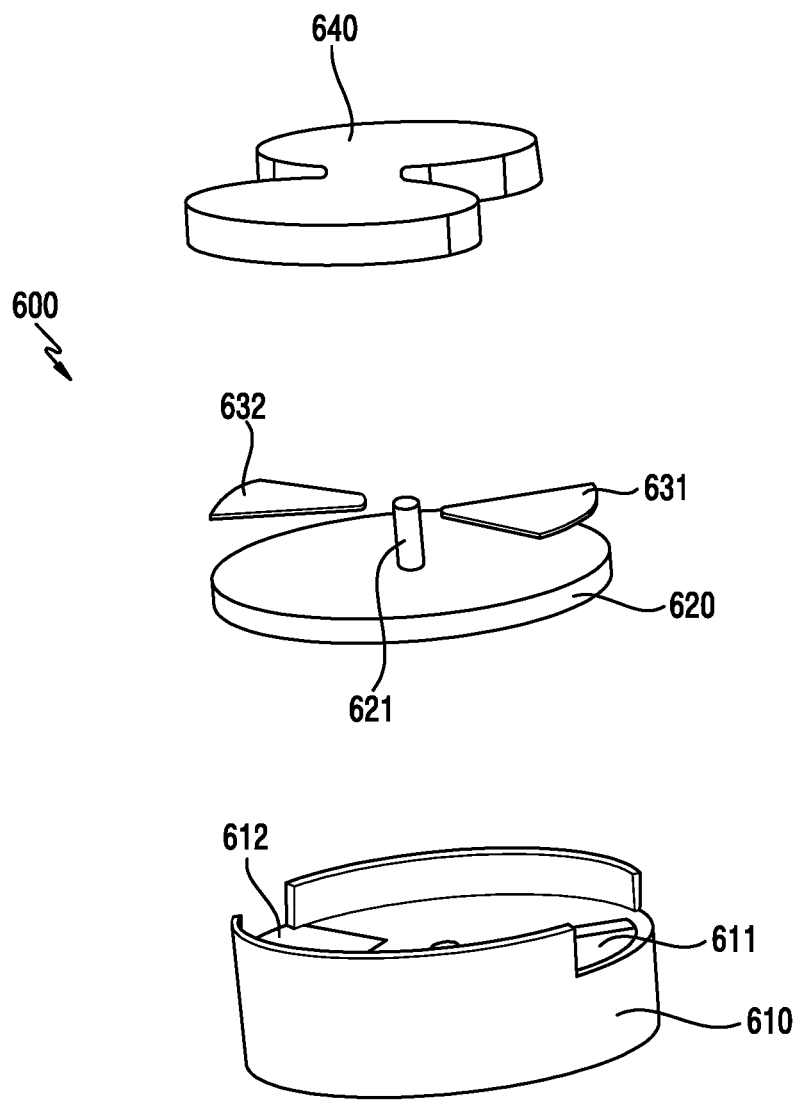
FIG. 6A is an exploded perspective view of a driver according to various embodiments of the present disclosure.

FIG. 6A is an exploded perspective view of a driver according to various embodiments of the present disclosure.

The driver of FIG. 6A may be similar to the driver 530 of FIG. 5B or may include other embodiments of the driver.

Referring to FIG. 6A, the driver 600 may include a motor housing 610, a vibrator 620 accommodated in an inside space (for example, an inside space 613 of FIG. 6C) of the motor housing 610 and vertically performing a reciprocating motion along a driving shaft 621, a pair of plate films 631, 632 for causing a flow of air according to the vertical reciprocating motion of the vibrator 620, and a shielding member 640 disposed on an upper portion of the motor housing 610 to perform a shielding role so as to normally discharge a sound generated at a speaker module (for example, the speaker module 520 of FIG. 5B) to the outside. According to one embodiment, the vibrator 620 may be formed to have substantially the same area as a cross section of the inside space of the motor housing 610, and may vertically reciprocate along the driving shaft 621, thereby causing a flow of air in the inside space of the motor housing 610 in a predetermined direction by the pair of plate films 631, 632.

Figure 6B:
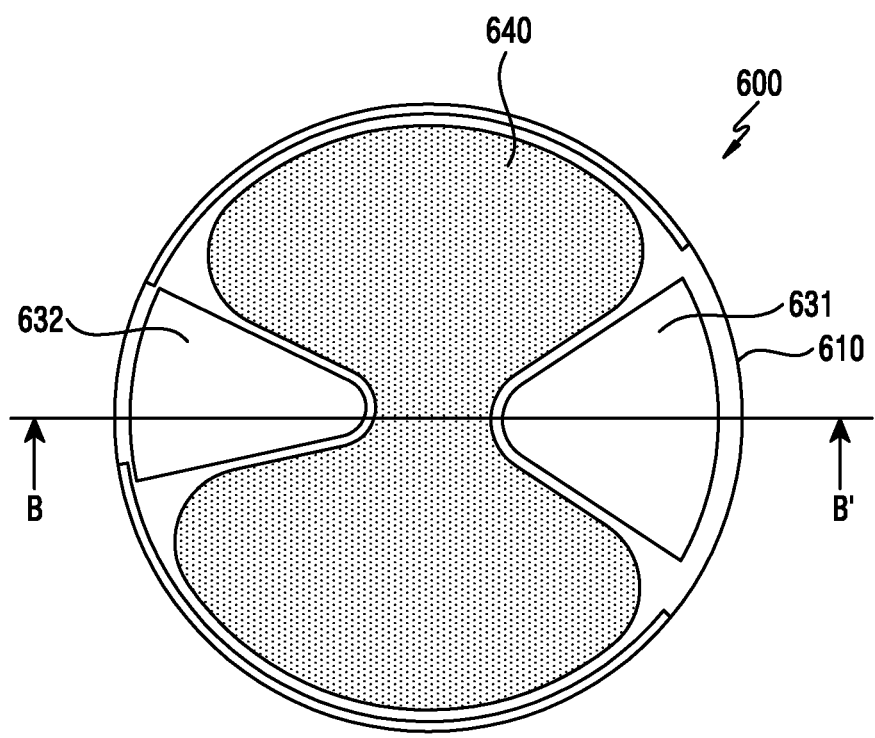
FIG. 6B is a plane view showing a coupled state of the driver according to various embodiments of the present disclosure.
Figure 6C:
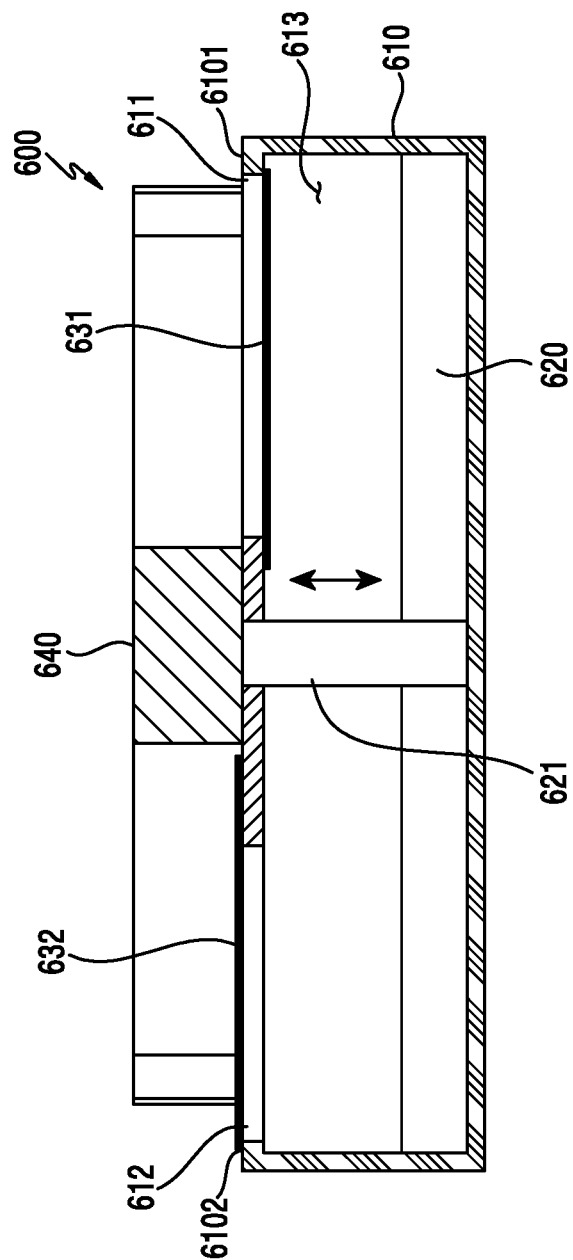
FIG. 6C is a cross section view showing a coupled state of the driver according to various embodiments of the present disclosure.

FIG. 6B is a plane view showing a coupled state of the driver according to various embodiments of the present disclosure. FIG. 6C is a cross section view showing the coupled state of the driver according to various embodiments of the present disclosure. FIG. 6C is a cross section view taken along line B-B' of FIG. 6B.

Referring to FIGS. 6B and 6C, the motor housing 610 may be disposed in an inside space (e.g., an "interior" space, such as for example the third space 513 of FIG. 5B) of a speaker housing (for example, the speaker housing 510 of FIG. 5B). According to one embodiment, the motor housing 610 may include a pair of openings 611, 612 formed on the upper portion thereof at locations facing each other with reference to the driving shaft 621. According to one embodiment, the pair of plate films 631, 632 may serve to selectively seal the pair of openings 611, 612 according to the vertical reciprocating motion of the vibrator 620.

According to various embodiments, the pair of plate films 631, 632 may include a first plate film 631 disposed in the first opening 611 and a second plate film 632 disposed in the second opening 612. According to one embodiment, the first plate film 631 and the second plate film 632 may be disposed by having their ends fixed to the upper portion of the motor housing 610. According to one embodiment, the first plate film 631 and the second plate film 632 may be formed of a thin film of metal, and in this case, the first plate film 631 and the second plate film 632 may be attached to the motor housing 610 of metal by welding (such as, for example, spot welding). According to one embodiment, the first plate film 631 may have one end fixed to the first opening 611 and the other end disposed to move in the inside space 613 of the motor housing 610 by receiving interference by a first end 6101 of the first opening 611. According to one embodiment, the second plate film 632 may have one end fixed to the second opening 612 and the other end disposed to move in an outside space of the motor housing 610 by receiving interference by a second end 6102 of the second opening 612.

According to various embodiments, the sealing member 640 may be disposed to shield between the first opening 611 through which external air enters and the second opening 612 through which air is discharged in the inside space (for example, the third space 513 of FIG. 5B) of the speaker housing (for example, the speaker housing 510 of FIG. 5B).

According to one embodiment, the first opening 611 may be spatially connected with an air inlet (for example, the air inlet 5131 of FIG. 5B) formed in the speaker housing (for example, the speaker housing 510 of FIG. 5B), and the second opening 612 may be disposed to be spatially connected with a second space (for example, the second space 511 of FIG. 5B) of the speaker housing (for example, the speaker housing 510 of FIG. 5B) in which the speaker module (for example, the speaker module 520 of FIG. 5B) is disposed. According to one embodiment, the shielding member 640 may include sponge, rubber, urethane, silicon, or a nonwoven fabric capable of preventing leakage of a speaker sound.

Figure 7A:
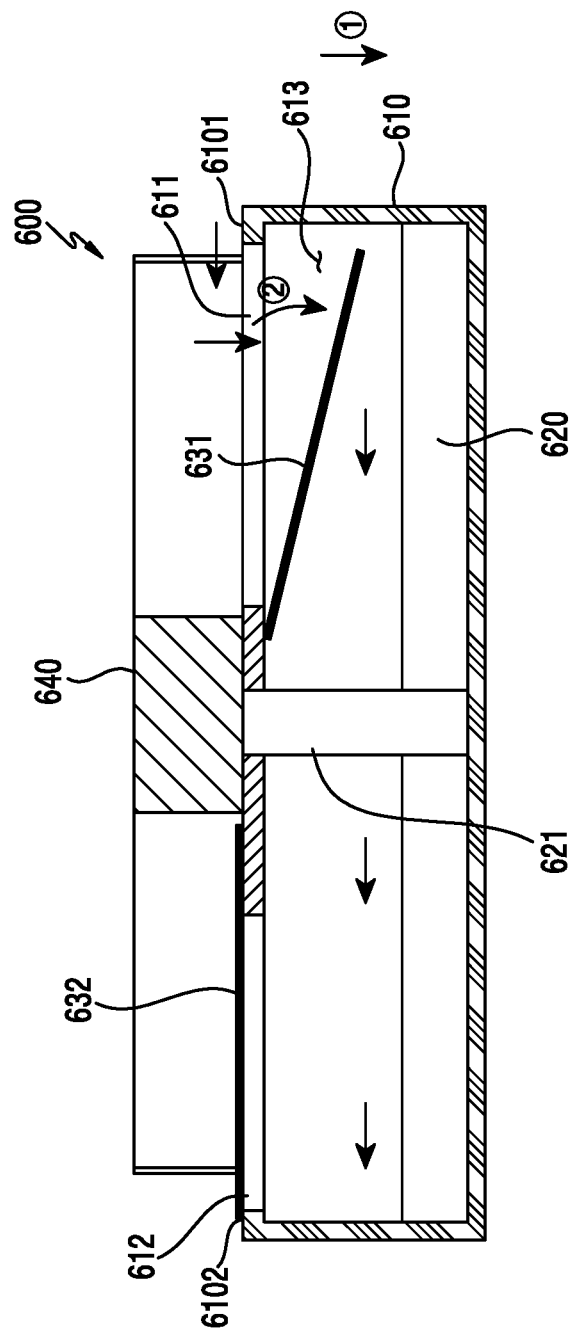
FIG. 7A and FIG. 7B are views showing an operation state of the driver according to various embodiments of the present disclosure.
Figure 7B:
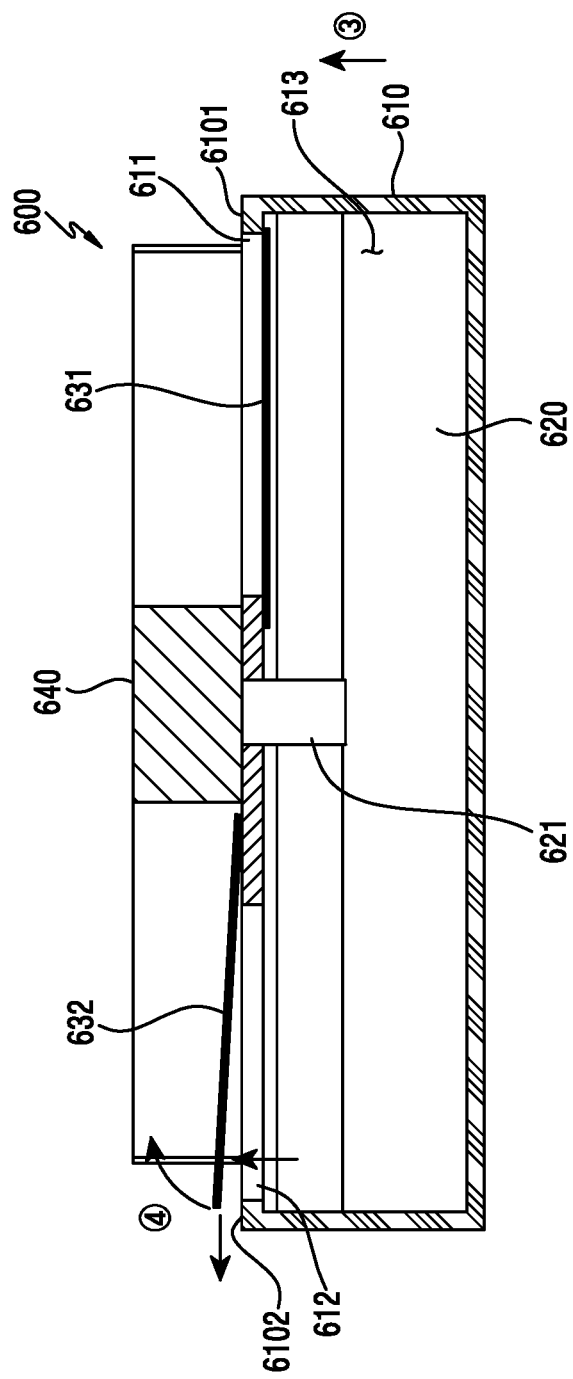

FIGS. 7A and 7B are views showing an operation state of the driver according to various embodiments of the present disclosure.

Referring to FIG. 7A, the vibrator 620 disposed inside the motor housing 610 of the driver 600 may descend in a downward direction (for example, a direction of ①) along the driving shaft 621. According to one embodiment, the first plate film 631 may move in a direction (for example, a direction of ②) toward the inside space 613 of the motor housing 610, and accordingly, external air may be introduced into the inside space 613 of the motor housing 610 through the first opening 611. At the same time, the second opening 612 may maintain a sealed state since the second plate film 632 is locked by the second end 6102 of the second opening 612 and is regulated thereby.

Referring to FIG. 7B, the vibrator 620 disposed inside the motor housing 610 of the driver 600 may ascend in an upward direction (for example, a direction of ③) along the driving shaft 621. According to one embodiment, the first opening 611 may maintain a sealed state since the first plate film 631 is locked by the first end 6101 of the first opening 611 in the inside space of the motor housing 610 and is regulated thereby. At the same time, the second plate film 632 may move in an outward direction (for example, a direction of ④) of the motor housing 610 and may discharge air in the motor housing 610 to the outside through the second opening 612. According to one embodiment, air discharged through the second opening 612 may be discharged to, for example, the first space 561 through the third space 513 and the second space 511 of FIG. 5B. According to one embodiment, residual water existing in at least one of the third space 513, the second space 511, or the first space 561 of FIG. 5B may be discharged to the outside by such a flow of air.

According to various embodiments, air existing outside the speaker housing (for example, the speaker housing 510 of FIG. 5B) may be moved to a space for discharging a sound (such as, for example, the first space 561 of FIG. 5B) through the first opening 611, the inside space 613, and the second opening 612 of the motor housing by the repeated vertical reciprocating motion of the vibrator 620.

According to various embodiments, the electronic device (for example, the electronic device 400 of FIG. 4) may control driving of the driver 600. For example, the electronic device (for example, the electronic device 400 of FIG. 4)

may control a motor to have a first number of rotations when the driver 600 is used as a means for providing a tactile sensation. According to one embodiment, the electronic device (for example, the electronic device 400 of FIG. 4) may control the motor to have a second number of rotations when the driver 600 is used as a water repelling means for removing residual water. According to one embodiment, the electronic device (for example, the electronic device 400 of FIG. 4) may control the first number of rotations to be relatively larger than the second number of rotations. This is to control the second number of rotations to have a low number of rotations that does not influence the water repellent operation and also does not allow the user of the electronic device to feel.

According to various embodiments, the electronic device (for example, the electronic device 400 of FIG. 4) may control a reciprocating cycle of the vibrator 620 to have a first reciprocating cycle when the driver 600 is used as a means for providing a tactile sensation. According to one embodiment, the electronic device (for example, the electronic device 400 of FIG. 4) may control the reciprocating cycle of the vibrator 620 to have a second reciprocating cycle when the driver 600 is used as a water repelling means for removing residual water. According to one embodiment, the electronic device (for example, the electronic device 400 of FIG. 4) may control the first reciprocating cycle to be relatively smaller than the second reciprocating cycle. This is to control the second reciprocating cycle to have a relatively long reciprocating cycle that does not influence the water repellent operation and also does not allow the user of the electronic device to feel.

Figure 8A:
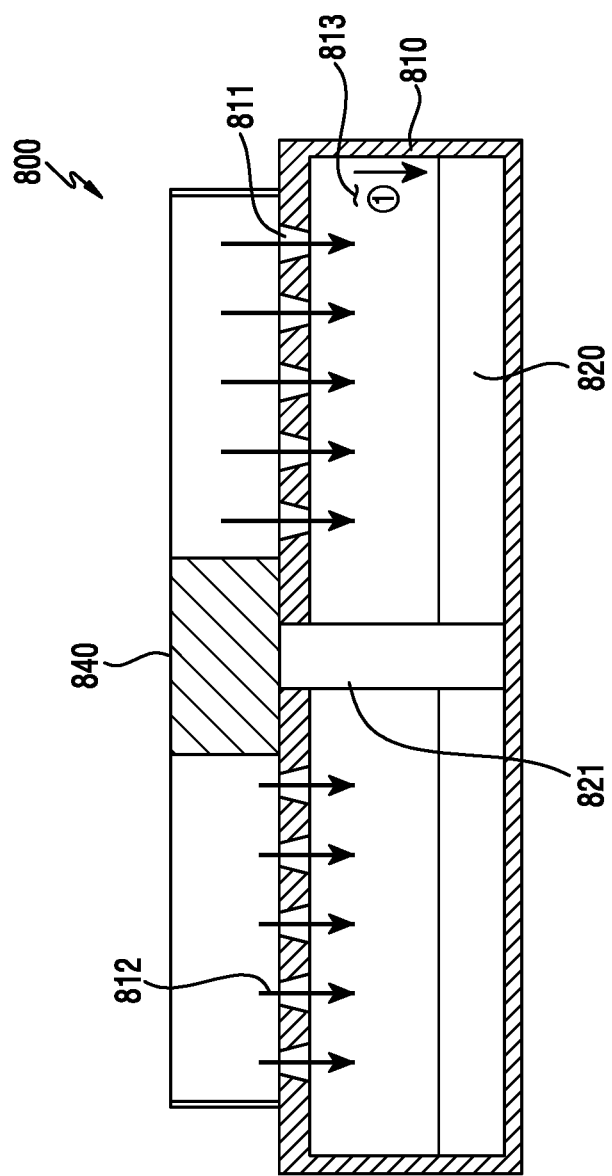
FIG. 8A and FIG. 8B are views showing a configuration and an operation state of a driver according to various embodiments of the present disclosure.
Figure 8B:
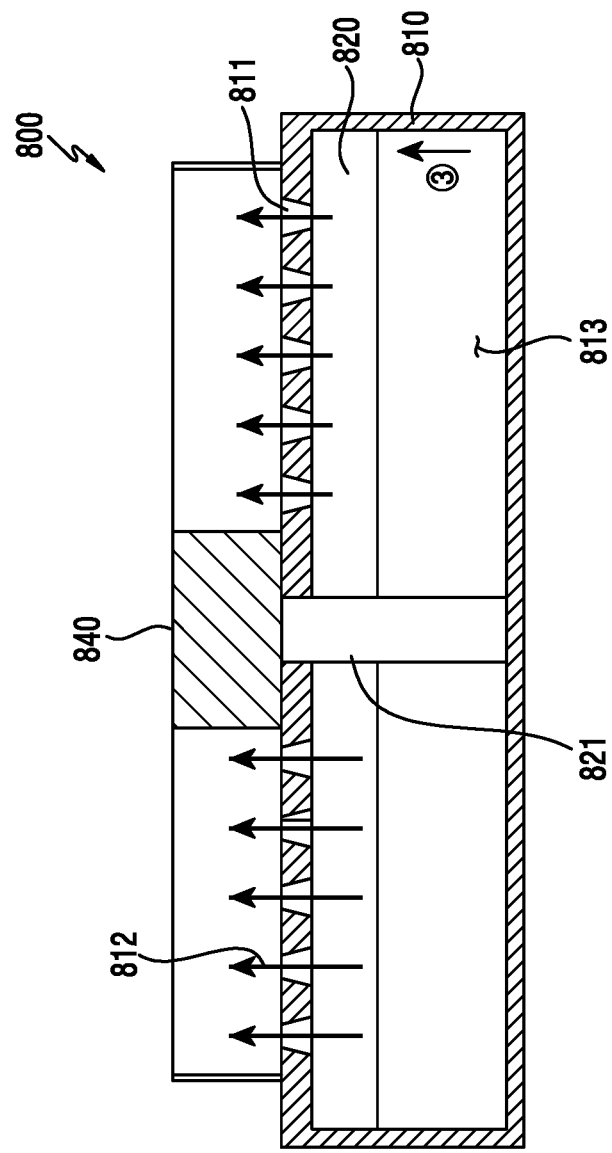

FIGS. 8A and 8B are views illustrating a configuration and an operation state of a driver according to various embodiments of the present disclosure.

The driver 800 of FIGS. 8A and 8B may be similar to the driver 530 of FIG. 5B or may include other embodiments of the driver.

Referring to FIG. 8A, the driver 800 may include a motor housing 810, a vibrator 820 which is accommodated in an inside space 813 (e.g., interior, hollow or cavity) of the motor housing 810 and vertically reciprocates along a driving shaft 821, and a shielding member 840 which is disposed on the upper portion of the motor housing 810. The shielding member 840 performs a shielding role in normal discharge of sound generated at a speaker module (for example, the speaker module 520 of FIG. 5B) to an exterior of the device. According to one embodiment, the vibrator 820 may be formed so as to have substantially the same area as a cross section of the inside space 813 of the motor housing 810, and may vertically reciprocate along the driving shaft 821, thereby generating a flow of air in the inside space 813 of the motor housing 810 in a predetermined direction due to a shape of the air inlets 811 and air outlets 812 formed on the upper portion of the motor housing 810.

According to various embodiments, the motor housing 810 may include a plurality of air inlets 811, each of which is formed on the upper portion thereof at one side with reference to the driving shaft, and including a cross section that gradually tapers (e.g., becomes smaller as one traverses from an upper portion to a lower portion thereof). According to one embodiment, the motor housing 810 may include a plurality of air outlets 812, each of which is formed at a location opposite to the air inlet 811 with reference to the driving shaft 821 and has a cross section that gradually tapers. Accordingly, air disposed outside the driver 800 may be caused to flow into the air inlets 811 to be discharged through the air outlets 812 according to a vertical reciprocating motion of the vibrator 820.

According to various embodiments, the vibrator 820 disposed inside the motor housing 810 of the driver 800 may descend in a downward direction (for example, a direction of ① of FIG. 8A) along the driving shaft 821. According to one embodiment, air disposed outside the driver 800 may be drawn in through the air inlets 811 formed on the motor housing 810. In this case, an amount of external air may be relatively larger than an amount of air drawn in through the air outlets 812 due to the shape of the air inlets 811 (e.g., a shape having the upper cross section larger than the lower cross section).

Referring to FIG. 8B, the vibrator 820 disposed in the inside space 813 of the motor housing 810 of the driver 800 may ascend in an upward direction as it reciprocates (for example, a direction of ③ of FIG. 8B) along the driving shaft 821. According to one embodiment, air existing in the inside space of the driver 800 may be discharged through the air outlets 812 by pressure generated by motion of the vibrator 820. In this case, an amount of air discharged through the air outlets 812 may be relatively larger than an amount of air discharged through the air inlets 811 due to the shape of the air outlets 812 (e.g., a shape having the upper cross section smaller than the lower cross section).

According to various embodiments, air disposed outside the speaker housing (for example, the speaker housing 510 of FIG. 5B) may be moved to a space for discharging a sound (for example, the first space 561 of FIG. 5B) through the air inlets 811, the inside space 813, and the air outlets 812 of the motor housing 810 by the repeated vertical reciprocating motion of the vibrator 820.

According to various embodiments, the electronic device (for example, the electronic device 400 of FIG. 4) may control driving of the driver 800. For example, the electronic device (for example, the electronic device 400 of FIG. 4) may control a motor to have a first number of rotations when the driver 800 is used as a means for providing a tactile sensation. According to one embodiment, the electronic device (for example, the electronic device 400 of FIG. 4) may control the motor to have a second number of rotations when the driver 800 is used as a water repelling means for removing residual water. According to one embodiment, the electronic device (for example, the electronic device 400 of FIG. 4) may control the first number of rotations to be relatively larger than the second number of rotations. This is to control the motor such that the second number of rotations has a low number of rotations that does not influence the water repellent operation and also does not allow the user of the electronic device to feel.

According to various embodiments, the electronic device (for example, the electronic device 400 of FIG. 4) may control a reciprocating cycle of the vibrator 820 to have a first reciprocating cycle when the driver 800 is used as a means for providing a tactile sensation. According to one embodiment, the electronic device (for example, the electronic device 400 of FIG. 4) may control the reciprocating cycle of the vibrator 820 to have a second reciprocating cycle when the driver 800 is used as a water repelling means for removing residual water. According to one embodiment, the electronic device (for example, the electronic device 400 of FIG. 4) may control the first reciprocating cycle to be relatively smaller than the second reciprocating cycle. This is to control the second reciprocating cycle to have a relatively long reciprocating cycle that does not influence the water repellent operation and also does not allow the user of the electronic device to feel.

Figure 9:
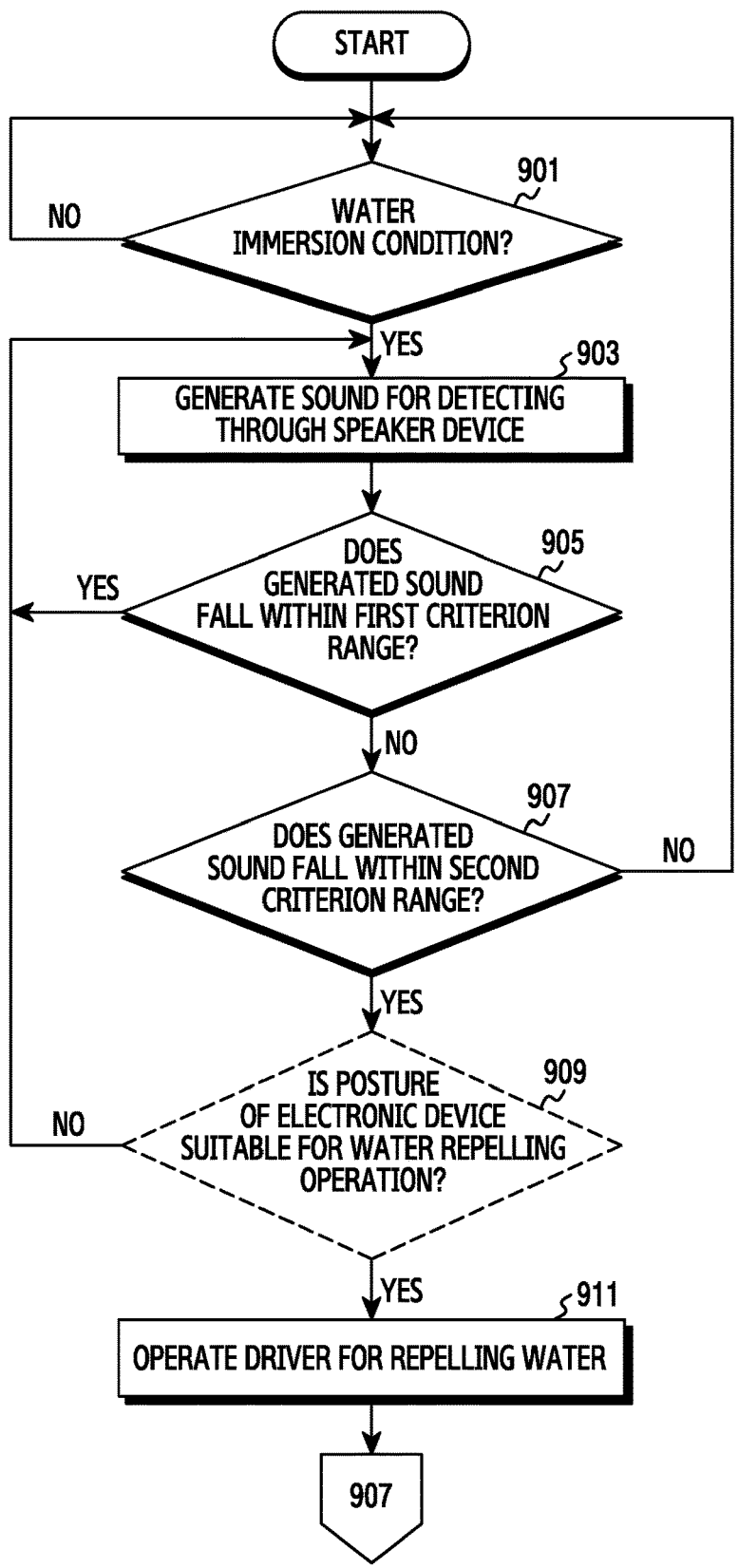
FIG. 9 is a flowchart showing a water repelling operation of an electronic device according to various embodiments of the present disclosure.

FIG. 9 is a flowchart showing a water repelling operation of an electronic device according to various embodiments of the present disclosure.

Referring to FIG. 9, in operation 901, the electronic device (for example, the electronic device 201 of FIG. 2) may determine whether the electronic device is in a first environment, which may include a water immersion condition (for example, an underwater environment) or a condition in which it would be difficult to repel water. Such a condition could include, for example, an orientation of the device such that an opening for a speaker (for example, the first space 561, the second space 511, or the third space 513 of FIG. 5B) is inclined at a slope relatively opposite a direction of gravity such that water could trickle into the speaker. According to one embodiment, the electronic device (for example, the electronic device 201 of FIG. 2) may detect the water immersion condition through a touch panel (for example, the touch panel 252 of FIG. 2). However, other implementations are possible. For example, the electronic device (for example, the electronic device 201 of FIG. 2) may determine the water immersion condition through an ultrasonic sensor.

In operation 903, the electronic device (for example, the electronic device 201 of FIG. 2) may control a speaker device to generate a sound for detecting the water immersion condition (for example, the speaker 282 of FIG. 2). According to one embodiment, the sound for detecting may include a sound having a non-audible frequency band. According to one embodiment, the sound for detecting may include a super-high frequency band or an ultra-low frequency band.

According to one embodiment, in operation 905, the electronic device (for example, the electronic device 201 of FIG. 2) may receive the sound for detecting, which is generated through the speaker (for example, the speaker 282 of FIG. 2), through a microphone device (for example, the microphone 288 of FIG. 2). According to one embodiment, the electronic device (for example, the electronic device 201 of FIG. 2) may determine whether the sound received through the microphone device (for example, the microphone 288 of FIG. 2) falls within a first criterion range (e.g., a predetermined threshold range). According to one embodiment, the microphone device (for example, the microphone 288 of FIG. 2) may include a directional microphone device or a nondirectional microphone device.

According to various embodiments, the electronic device (for example, the electronic device 201 of FIG. 2) may determine that the electronic device is in the water immersion condition when the frequency of the sound detected through the speaker device (for example, the speaker 282 of FIG. 2) falls within the first criterion range, and therefore proceed to performing operation 903. According to one embodiment, when the frequency of the sound detected through the speaker device (for example, the speaker 282 of FIG. 2) does not fall within the first criterion range, the electronic device (for example, the electronic device 201 of FIG. 2) may determine that the electronic device has been taken out of water or is not at risk of being exposed to water.

In operation 907, when the frequency of the sound detected through the speaker device (for example, the speaker 282 of FIG. 2) does not fall within the first criterion range, the electronic device (for example, the electronic device 201 of FIG. 2) may determine whether the generated sound falls within a second criterion range (e.g., a second predetermined range). According to one embodiment, when the generated sound does not fall within the second criterion range, the electronic device (for example, the electronic device 201 of FIG. 2) may determine that the electronic device is not in the water immersion condition and control to perform operation 901. In this case, the electronic device (for example, the electronic device 201 of FIG. 2) may determine that the electronic device is in a condition in which a normal speaker sound is generated since the sound generated through the speaker device (for example, the speaker 282 of FIG. 2) does not match a value of the first criterion range (a range value in the water immersion condition) and a value of the second criterion range (a range value in a condition in which residual water exists).

According to various embodiments, in operation 907, when it is determined that the generated sound falls within the second criterion range, the electronic device (for example, the electronic device 201 of FIG. 2) may detect a second environment. According to one embodiment, the second environment may include a condition in which residual water exists in the speaker sound guide path (for example, the first space 561, the second space 511, or the third space 513 of FIG. 5B) or a condition in which it is easy to repel water (for example, a condition in which the speaker sound guide path has a slope close to the direction of gravity).

In operation 911, when it is determined that residual water exists in the speaker sound guide path, the electronic device (for example, the electronic device 201 of FIG. 2) may operate a driver for repelling water to remove the residual water. According to one embodiment, the electronic device (for example, the electronic device 201 of FIG. 2) may operate the driver 600 according to a predetermined number of rotations or for a predetermined driving time. According to one embodiment, as shown in FIGS. 7A and 7B, the electronic device (for example, the electronic device 201 of FIG. 2) may control the driver 600 to cause external air of the speaker housing (for example, the speaker housing 510 of FIG. 5B) to flow into a space for discharging a sound (for example, the first space 561 of FIG. 5B) through the first opening 611, the inside space 613, and the second opening 612 of the motor housing by performing a repeated vertical reciprocating motion of the vibrator 620 of the driver 600 and a selective opening and closing operation of the plate films 631, 632, thereby discharging residual water with air. According to one embodiment, as shown in FIGS. 8A and 8B, the electronic device (for example, the electronic device 201 of FIG. 2) may control the driver 800 to cause external air of the speaker housing (for example, the speaker housing 510 of FIG. 5B) to flow into a space for discharging a sound (for example, the first space 561 of FIG. 5B) through the air inlets 811, the inside space 813, and the air outlets 812 using a repeated vertical reciprocating motion of the vibrator 820 of the driver 800 and structural shapes of the air inlets 811 and the air outlets 812 of the motor housing 810, thereby discharging residual water with air.

According to various embodiments, when the operation of the driver in operation 911 is completed, the electronic device (for example, the electronic device 201 of FIG. 2) may return to operation 907 to repeatedly detect whether residual water exists in the speaker sound guide path (for example, the first space 561, the second space 511, or the third space 513 of FIG. 5B). In operation 909, the electronic device (for example, the electronic device 201 of FIG. 2) may determine whether a current posture of the electronic device, as a parameter for operating the driver, is suitable for the water repelling operation. According to one embodiment, the electronic device (for example, the electronic device 201 of FIG. 2) may detect the current posture of the electronic device using a gyro sensor (for example, the gyro sensor 240B of FIG. 2).

Figure 10:
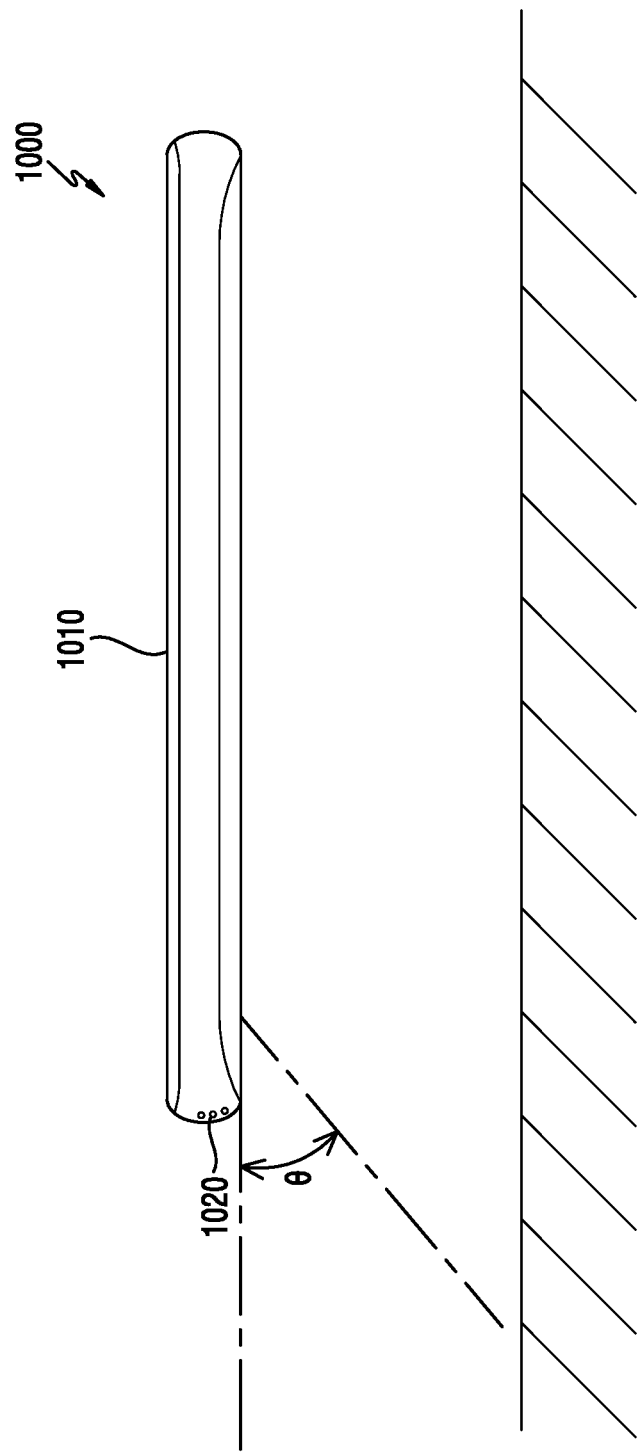
FIG. 10 is a view showing a posture state for a water repelling operation of an electronic device according to various embodiments of the present disclosure.

FIG. 10 is a view to illustrate a posture state for repelling water in an electronic device according to various embodiments of the present disclosure. The electronic device 1000 may control to perform the water repelling operation when a sound generated through a speaker device 1020 falls within the second criterion range value in operation 907 and a direction of a first space (for example, the first space 561 of FIG. 5B) is tilted by more than a predetermined angle θ in the direction of gravity (a direction toward the ground). This is attributable to the fact that it is easy to repel water as the direction of the first space (for example, the first space 561 of FIG. 5B) is closer to the direction of gravity. According to one embodiment, when the sound generated through the speaker device 1020 falls within the second criterion range value in operation 907, but the speaker device 1020 is not tilted toward the ground by more than the predetermined angle 0, the electronic device may control not to initiate the water repelling operation. Reference numeral 1010 which is not explained may indicate a display.

According to various embodiments of the present disclosure, by effectively removing residual water existing in a space opened from the inside to the outside after the electronic device is immersed in water, performance of electronic components can be prevented from being degraded in advance.

According to various embodiments, there is provided an electronic device including: a speaker module including a front surface for outputting a sound and a side surface adjacent to the front surface; and a speaker housing configured to accommodate the speaker module therein, wherein the speaker housing includes: a first separation member configured to separate a first space opened to an outside of the speaker housing from a second space formed on the front surface of the speaker module; and a driver disposed in a third space which is spatially connected with the second space to generate an air pressure difference between the second space and the first space.

According to various embodiments, the electronic device may further include a second separation member disposed between the second space and the driver to spatially separate the second space and the driver from each other.

According to various embodiments, residual water existing on the periphery of the second space or the first separation member may be discharged in a direction toward the first space by a flow of air generated by the air pressure difference.

According to various embodiments, the first separation member may include a mesh.

According to various embodiments, the second separation member may include Goretex.

According to various embodiments, the electronic device may further include: a detector configured to detect whether the electronic device is in a first environment or a second environment; and at least one processor functionally connected with the detector, and, when a change from the first environment to the second environment is detected, the processor may be configured to drive the driver to generate the air pressure difference between the second space and the first space.

According to various embodiments, the processor may be configured to: detect the first environment in which the electronic device is immersed in water through a touch panel; and, when a sound for detecting which is generated at the speaker module and is detected through a microphone device falls within a criterion range, detect the second environment in which water exists on the periphery of the second space or the first separation member.

According to various embodiments, the processor may be configured to: when a sound for detecting which is generated at the speaker module and is detected through a microphone device falls within a criterion range, detect the first environment in which water exists on the periphery of the second space or the first separation member, and, through a gyro sensor, detect the second environment in which a direction of the first space has a slope of more than a predetermined angle with respect to the direction of gravity.

According to various embodiments, the driver may include: a motor housing; a vibrator configured to reciprocate with reference to a driving shaft in an inside space of the motor housing; a member configured to generate the air pressure difference by causing a flow of air caused by the reciprocating motion of the vibrator; and a blocking member including a function of blocking a sound from at least the second space.

According to various embodiments, the member configured to generate the air pressure difference may include: a first plate film member configured to selectively seal a first opening of the motor housing; and a second plate film member configured to selectively seal a second opening of the motor housing, and, when the vibrator is moved to a first position, air may flow into the inside space by an operation of the first plate film, and, when the vibrator is moved to a second position, air in the inside space may be discharged to the outside by an operation of the second plate film.

According to various embodiments, the member configured to generate the air pressure difference may include: a plurality of air inlets formed in the motor housing and having an upper cross section larger than a lower cross section; and a plurality of air outlets formed in the motor housing and having an upper cross section smaller than a lower cross section, and, when the vibrator is moved to a first position, air may flow into the inside space due to the shape of the air inlets, and, when the vibrator is moved to a second position, air in the inside space may be discharged to the outside due to the shape of the air outlets.

According to various embodiments, the blocking member may be configured to spatially separate a region through which air of the motor housing is drawn in and a region through which air is discharged.

According to various embodiments, the driver may include a vibrator configured to provide a tactile sensation of the electronic device.

According to various embodiments, there is provided an operation method of an electronic device including: determining whether the electronic device is in a water immersion condition through a touch panel; in the water immersion condition, generating a sound for detecting through a speaker device; detecting the generated sound through a microphone device; determining whether the detected sound matches a reference value which is set for determining residual water existing in the electronic device; and, when the detected sound matches the reference value, operating a driver for discharging the residual water.

According to various embodiments, the operation method may further include: when the detected sound matches the reference value, determining whether a direction of a first space has a slope of more than a predetermined angle with respect to the direction of gravity through a gyro sensor; and, when the direction of the first space has the slope of more than the predetermined angle, operating the driver.

According to various embodiments, there is provided an electronic device including: a housing including at least one electronic component and disposed inside the electronic device; a first separation member configured to separate a first space opened to an outside of the electronic device through the housing from a second space in which the electronic component is disposed; and a driver disposed in a third space spatially connected with the second space in an inside space of the housing, and configured to generate an air pressure difference between the second space and the first space.

According to various embodiments, the electronic device may further include a second separation member disposed between the second space and the driver to spatially separate the second space and the driver from each other.

According to various embodiments, residual water existing on the periphery of the second space or the first separation member may be discharged in a direction toward the first space by a flow of air generated by the air pressure difference.

According to various embodiments, the driver may include: a motor housing; a vibrator configured to reciprocate with reference to a driving shaft in an inside space of the motor housing; a first plate film member configured to selectively seal a first opening of the motor housing; a second plate film member configured to selectively seal a second opening of the motor housing; and a blocking member disposed to partially separate the first opening and the second opening from each other, and, when the vibrator is moved to a first position, air may flow into the inside space by an operation of the first plate film, and, when the vibrator is moved to a second position, air in the inside space may be discharged to the outside by an operation of the second plate film.

According to various embodiments, the electronic component may include at least one of a speaker module, a microphone module, a temperature/humidity detection sensor, an odor sensor, an interface connector port, or an ear jack module.

According to various embodiments, there is provided an apparatus for generating an air pressure difference between two positions spatially connected to each other in an electronic device, the apparatus including: a motor housing disposed at least one of the two positions; a vibrator configured to reciprocate with reference to a driving shaft in an inside space of the motor housing; and a member configured to generate the air pressure difference by causing a flow of air by the reciprocating motion of the vibrator.

According to various embodiments, the member configured to generate the air pressure difference may include: a first plate film member configured to selectively seal a first opening of the motor housing; and a second plate film member configured to selectively seal a second opening of the motor housing, and, when the vibrator is moved to a first position in the motor housing, air may flow into the inside space by an operation of the first plate film, and, when the vibrator is moved from the first position to a second position, air in the inside space may be discharged to the outside by an operation of the second plate film.

According to various embodiments, the member configured to generate the air pressure difference may include: a plurality of air inlets formed in the motor housing and having an upper cross section larger than a lower cross section; and a plurality of air outlets formed in the motor housing and having an upper cross section smaller than a lower cross section, and, when the vibrator is moved to a first position in the motor housing, air may flow into the inside space due to the shape of the air inlets, and, when the vibrator is moved from the first position to a second position, air in the inside space may be discharged to the outside due to the shape of the air outlets.

What is claimed is:
1. An electronic device comprising:
a speaker module including a front surface for outputting sound, and a side surface adjacent to the front surface; and
a speaker housing at least partially enclosing the speaker module,
wherein the speaker housing includes:
a first separation member configured to separate a first cavity at least partially open to an exterior of the speaker housing from a second cavity formed on the front surface of the speaker module, and
a driver separate from the speaker module and disposed in a third cavity extending from the second cavity to generate an air pressure differential between the second cavity and the first cavity by discharging an air in the third cavity to the first cavity through the second cavity.

2. The electronic device of claim 1, further comprising a second separation member disposed between the second cavity and the driver at least partially separating the second cavity from the driver.

3. The electronic device of claim 2, wherein the second separation member comprises expanded polytetrafluoroethylene.

4. The electronic device of claim 1, wherein residual water disposed on a periphery of the second cavity or the first separation member is discharged toward the first cavity by a flow of air generated by the air pressure differential.

5. The electronic device of claim 1, wherein the first separation member comprises a mesh.

6. The electronic device of claim 1, further comprising:
a detector configured to detect whether the electronic device is in a first environment or a second environment; and
at least one processor functionally connected with the detector, configured to:
responsive to detecting a change from the first environment to the second environment by the detector, activate the driver to generate the air pressure differential between the second cavity and the first cavity.

7. The electronic device of claim 6, further comprising:
a touch panel; and
a microphone device,
wherein the first environment includes immersion of the electronic device in water and the second environment includes disposition of water on a periphery of the second cavity or the first separate member,
wherein the processor is further configured to:
detect the first environment indicating immersion in water through the touch panel,
detect a sound generated at the speaker module and through the microphone device, and
responsive to determining that the detected sound falls within a predetermined threshold range, detect the second environment indicating the disposition of water on the periphery or the first separation member.

8. The electronic device of claim 6, further comprising:
a microphone device; and
a gyroscopic sensor,
wherein the first environment includes disposition of water on a periphery of the second cavity or the first separate member,
wherein the second environment indicates the first cavity is oriented to have a slope greater than a predetermined angle relative to a direction of gravity,
wherein the processor is configured to:

responsive to detecting a sound generated at the speaker module through the microphone device and determining the sound falls within a predetermined threshold range, detect that the electronic device is in the first environment, and responsive to detecting an orientation of the electronic device through the gyroscopic sensor indicating the first cavity is oriented at the slope greater than the predetermined angle, detect that the electronic device is in the second environment.

9. The electronic device of claim 1, wherein the driver comprises:
   a motor housing;
   a vibrator configured to reciprocate with reference to a driving shaft within a cavity of the motor housing;
   a member configured to generate the air pressure differential by affecting a flow of air generated by reciprocation of the vibrator; and
   a blocking member configured to obstruct sound originating from at least the second cavity.

10. The electronic device of claim 9, wherein the member generating the air pressure differential comprises:
   a first plate film member configured to selectively seal a first opening of the motor housing; and
   a second plate film member configured to selectively seal a second opening of the motor housing, and
   wherein, when the vibrator is moved to a first position, air flows into the cavity of the motor housing by operation of the first plate film member, and, when the vibrator is moved to a second position, air in the cavity of the motor housing is discharged to the exterior by operation of the second plate film member.

11. The electronic device of claim 9, wherein the member generating the air pressure differential comprises:
   a plurality of air inlets formed in the motor housing having a first taper such that an upper cross section larger than a lower cross section for each air inlet; and
   a plurality of air outlets formed in the motor housing and having a second taper such that an upper cross section smaller than a lower cross section for each air outlet,
   wherein, when the vibrator is moved to a first position, air flows into the cavity of the motor housing due to the first taper of each of the air inlets, and, when the vibrator is moved to a second position, air in the cavity of the motor housing is discharged to the outside due to the second taper of each of the air outlets.

12. The electronic device of claim 9, wherein the blocking member is configured to at least partially separate a region through which air of the motor housing is drawn and a region through which air is discharged.

13. The electronic device of claim 9, wherein the driver comprises a vibrator configured to provide a tactile haptic feedback.

14. An electronic device comprising:
   a housing;
   a first separation member configured to separate a first cavity at least partially exposed to an exterior of the electronic device through the housing from a second cavity in which at least one electronic component is disposed; and
   a driver disposed in a third cavity spatially coupled with the second cavity in an interior of the housing, the driver configured to generate an air pressure differential between the second cavity and the first cavity by discharging an air in the third cavity to the first cavity through the second cavity.

15. The electronic device of claim 14, further comprising a second separation member disposed between the second cavity and the driver to at least partially separate the second cavity from the driver.

16. The electronic device of claim 14, wherein residual water disposed on a periphery of the second cavity or the first separation member is discharged towards the first cavity by a flow of air generated by the air pressure differential.

17. The electronic device of claim 14, wherein the driver comprises:
   a motor housing;
   a vibrator configured to reciprocate relative to a driving shaft disposed in an interior of the motor housing;
   a first plate film member configured to selectively seal a first opening of the motor housing;
   a second plate film member configured to selectively seal a second opening of the motor housing; and
   a blocking member disposed to at least partially separate the first opening from the second opening, and
   wherein, when the vibrator is moved to a first position, air flows into the interior by operation of the first plate film, and, when the vibrator is moved to a second position, air in the interior is discharged to the exterior by operation of the second plate film.

18. The electronic device of claim 14, wherein the electronic component comprises at least one of a speaker module, a microphone module, a temperature/humidity detection sensor, an odor sensor, an interface connector port, and an ear jack module.

19. An apparatus for generating an air pressure differential in an electronic device, comprising:
   a motor housing disposed at least one of two positions within an interior of the electronic device;
   a vibrator configured to reciprocate relative to a driving shaft in an interior of the motor housing;
   a member configured to generate the air pressure differential by controlling a flow of air generated by reciprocation of the vibrator; and
   a blocking member configured to obstruct sound.

20. The apparatus of claim 19, wherein the member configured to generate the air pressure differential comprises:
   a first plate film member configured to selectively seal a first opening of the motor housing; and
   a second plate film member configured to selectively seal a second opening of the motor housing, and
   wherein, when the vibrator is moved to a first position in the motor housing, air flows into the interior by operation of the first plate film, and, when the vibrator is moved from the first position to a second position, air in the interior is discharged to an exterior by operation of the second plate film.

21. The apparatus of claim 19, wherein the member configured to generate the air pressure differential comprises:
   a plurality of air inlets formed in the motor housing and having a first taper such that an upper cross section larger is than a lower cross section for each air inlet; and
   a plurality of air outlets formed in the motor housing and having a second taper such that an upper cross section is smaller than a lower cross section for each air outlet,
   wherein, when the vibrator is moved to a first position in the motor housing, air flows into the interior due to the first taper of the air inlets, and when the vibrator is moved from the first position to a second position, air in the interior is discharged to an exterior due to the second taper of the air outlets.

\* \* \* \* \*